United States Patent
Nomiya

(10) Patent No.: US 11,963,302 B2
(45) Date of Patent: Apr. 16, 2024

(54) ELECTRONIC COMPONENT

(71) Applicant: Murata Manufacturing Co., Ltd., Nagaokakyo (JP)

(72) Inventor: Masato Nomiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 219 days.

(21) Appl. No.: 17/412,314

(22) Filed: Aug. 26, 2021

(65) Prior Publication Data

US 2021/0385949 A1 Dec. 9, 2021

Related U.S. Application Data

(63) Continuation of application No. PCT/JP2020/006635, filed on Feb. 19, 2020.

(30) Foreign Application Priority Data

Mar. 7, 2019 (JP) ................................. 2019-041952

(51) Int. Cl.
*H05K 1/11* (2006.01)
*H05K 1/09* (2006.01)

(52) U.S. Cl.
CPC .............. *H05K 1/117* (2013.01); *H05K 1/09* (2013.01); *H05K 2201/0364* (2013.01); *H05K 2201/0919* (2013.01)

(58) Field of Classification Search
CPC .................. H05K 1/117; H05K 2201/0364
See application file for complete search history.

(56) References Cited

U.S. PATENT DOCUMENTS 3,238,597 A * 3/1966 Rayburn ................ H05K 1/144
29/25.42
5,729,437 A * 3/1998 Hashimoto ....... H01L 23/49805
439/219

(Continued)

FOREIGN PATENT DOCUMENTS

JP    11-16760 A    1/1999
JP    11-330298 A   11/1999

(Continued)

OTHER PUBLICATIONS

Official Communication issued in International Patent Application No. PCT/JP2020/006635, dated May 19, 2020.

*Primary Examiner* — Hoa C Nguyen
*Assistant Examiner* — John B Freal
(74) *Attorney, Agent, or Firm* — Keating & Bennett, LLP

(57) ABSTRACT

An electronic component includes a substrate and side wires. The substrate includes a first major surface, a second major surface, and a side surface. The side wires are on the side surface of the substrate and spaced apart from each other in a direction along an outer periphery of the substrate when viewed in plan in a thickness direction of the substrate. At least a portion of each of the side wires is provided indirectly on the side surface of the substrate. The electronic component further includes an electrically insulating layer interposed between the side surface of the substrate and the at least a portion of each of the side wires. Each of the side wires includes a bent portion bent when viewed in plan in the thickness direction of the substrate.

20 Claims, 16 Drawing Sheets

(56) References Cited

U.S. PATENT DOCUMENTS

| | | | | |
|---|---|---|---|---|
| 5,966,052 | A * | 10/1999 | Sakai | H01L 23/50 |
| | | | | 257/E23.079 |
| 6,278,178 | B1 * | 8/2001 | Kwon | H01L 24/97 |
| | | | | 257/684 |
| 6,381,121 | B1 * | 4/2002 | Monden | H01G 9/025 |
| | | | | 252/62.2 |
| 6,534,726 | B1 * | 3/2003 | Okada | H05K 3/3442 |
| | | | | 174/266 |
| 8,749,989 | B1 * | 6/2014 | Kaylie | H01L 23/49805 |
| | | | | 361/768 |
| 2006/0231935 | A1 | 10/2006 | Nishida | |
| 2016/0268044 | A1 * | 9/2016 | Gu | H01G 4/12 |
| 2017/0250669 | A1 | 8/2017 | Kuroyanagi et al. | |
| 2018/0269849 | A1 | 9/2018 | Matsumoto et al. | |

FOREIGN PATENT DOCUMENTS

| | | |
|---|---|---|
| JP | 2000-068414 A | 3/2000 |
| JP | 2005-223280 A | 8/2005 |
| JP | 2006-294976 A | 10/2006 |
| JP | 2016-025239 A | 2/2016 |
| JP | 2017-157922 A | 9/2017 |
| WO | 2017/110308 A1 | 6/2017 |

* cited by examiner

ELECTRONIC COMPONENT

CROSS REFERENCE TO RELATED APPLICATIONS

This application claims the benefit of priority to Japanese Patent Application No. 2019-041952 filed on Mar. 7, 2019 and is a Continuation Application of PCT Application No. PCT/JP2020/006635 filed on Feb. 19, 2020. The entire contents of each application are hereby incorporated herein by reference.

BACKGROUND OF THE INVENTION

1. Field of the Invention

The present invention generally relates to an electronic component and, more specifically, to an electronic component including side wires.

2. Description of the Related Art

Hitherto, a chip electronic component including a substantially rectangular parallelepiped base and at least three outer electrodes arranged side by side on the same side surface of the base is known as an electronic component (see, for example, Japanese Unexamined Patent Application Publication No. 2005-223280).

In the chip electronic component described in Japanese Unexamined Patent Application Publication No. 2005-223280, each of the outer electrodes includes a side portion (side wire) formed on the side surface of the base.

In the chip electronic component described in Japanese Unexamined Patent Application Publication No. 2005-223280, when the number of side portions (side wires) provided on the same side surface of the base is increased without changing the size of the base when viewed in a thickness direction of the base (substrate), the distance between any adjacent side portions shortens, so there are concerns that it is easy to be influenced by capacitive coupling between the side portions. In this case, in the chip electronic component described in Japanese Unexamined Patent Application Publication No. 2005-223280, electrical characteristics can deteriorate.

SUMMARY OF THE INVENTION

Preferred embodiments of the present invention provide electronic components that each enable the number of side wires provided on a side surface of a substrate to be further increased.

An electronic component according to a preferred embodiment of the present invention includes a substrate and a plurality of side wires. The substrate includes a first major surface, a second major surface, and a side surface. The plurality of side wires are provided on the side surface of the substrate and spaced apart from each other in a direction along an outer periphery of the substrate when viewed in plan in a thickness direction of the substrate. At least a portion of each of the plurality of side wires is indirectly provided on the side surface of the substrate. The electronic component further includes an electrically insulating layer interposed between the side surface of the substrate and the at least a portion of each of the plurality of side wires. Each of the plurality of side wires includes a bent portion that is bent when viewed in plan in the thickness direction of the substrate.

With the electronic components according to preferred embodiments of the present invention, the number of side wires provided on the side surface of the substrate can be further increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
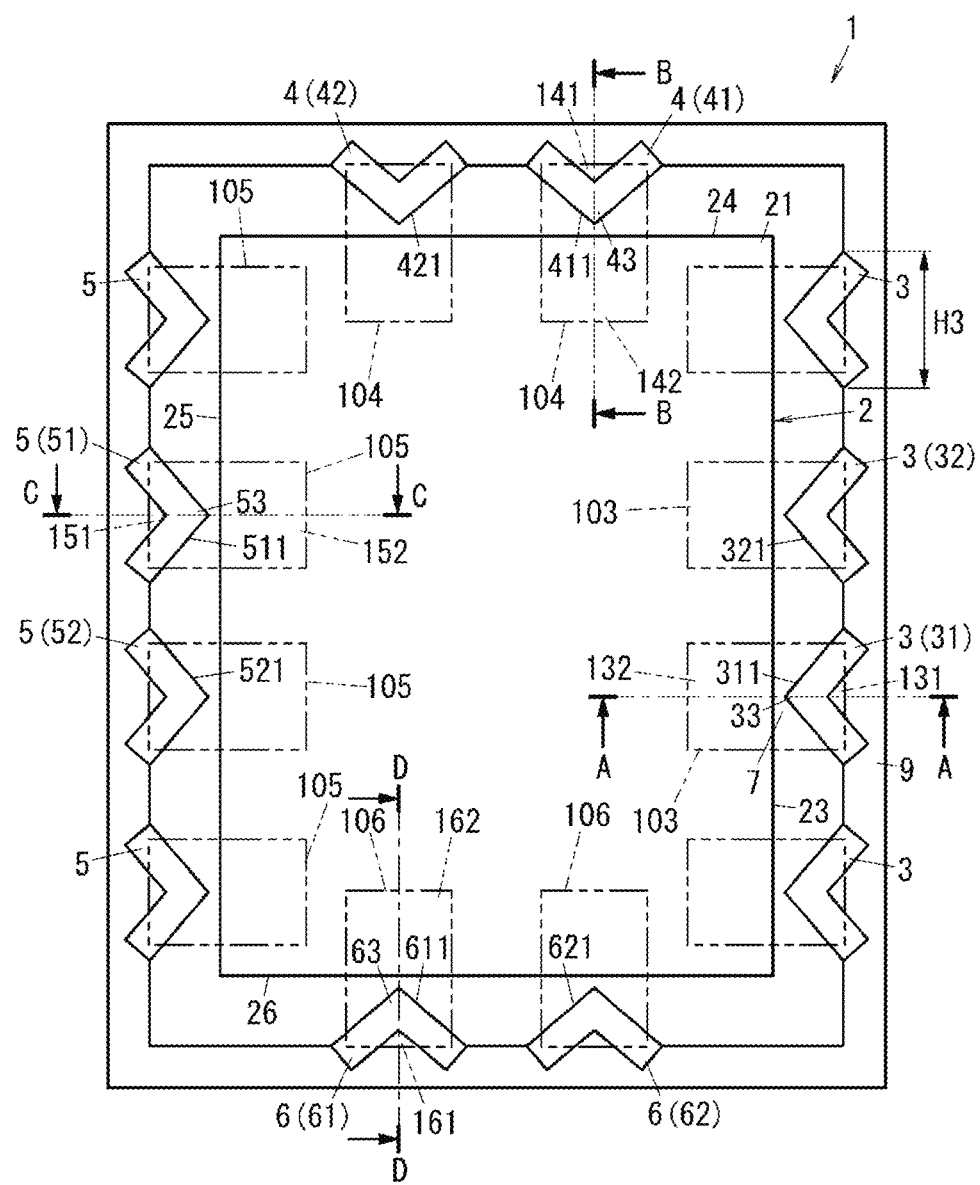
FIG. 1 is a plan view of an electronic component according to a first preferred embodiment of the present invention with a portion cut away.
Figure 2:
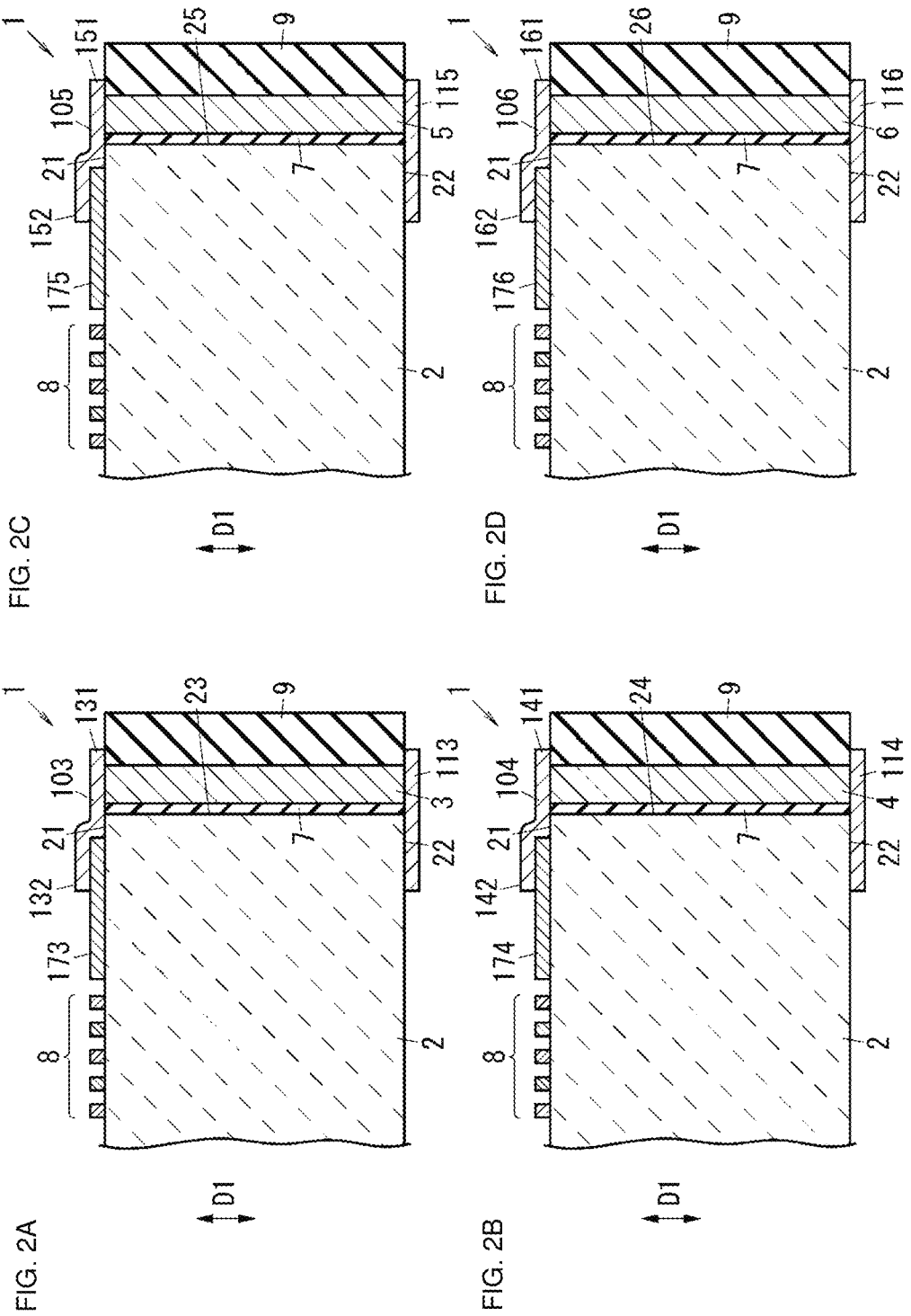
FIG. 2A is a cross-sectional view of the above-described electronic component, taken along the line A-A in FIG. 1.
FIG. 2B is a cross-sectional view of the above-described electronic component, taken along the line B-B in FIG. 1.
FIG. 2C is a cross-sectional view of the above-described electronic component, taken along the line C-C in FIG. 1.
FIG. 2D is a cross-sectional view of the above-described electronic component, taken along the line D-D in FIG. 1.

Preferred embodiments of the present invention will be described below with reference to the drawings.

FIG. 1, FIGS. 2A to 2D, and FIG. 3 to FIG. 16 that will be referenced in the following preferred embodiments and the like all are schematic diagrams, and the ratios of the sizes and thicknesses of component elements in the drawings do not always reflect actual scale ratios.

First Preferred Embodiment (1) Electronic Component

Hereinafter, an electronic component 1 according to the first preferred embodiment of the present invention will be described with reference to FIG. 1, FIGS. 2A to 2D, and FIG. 3.

Figure 3:
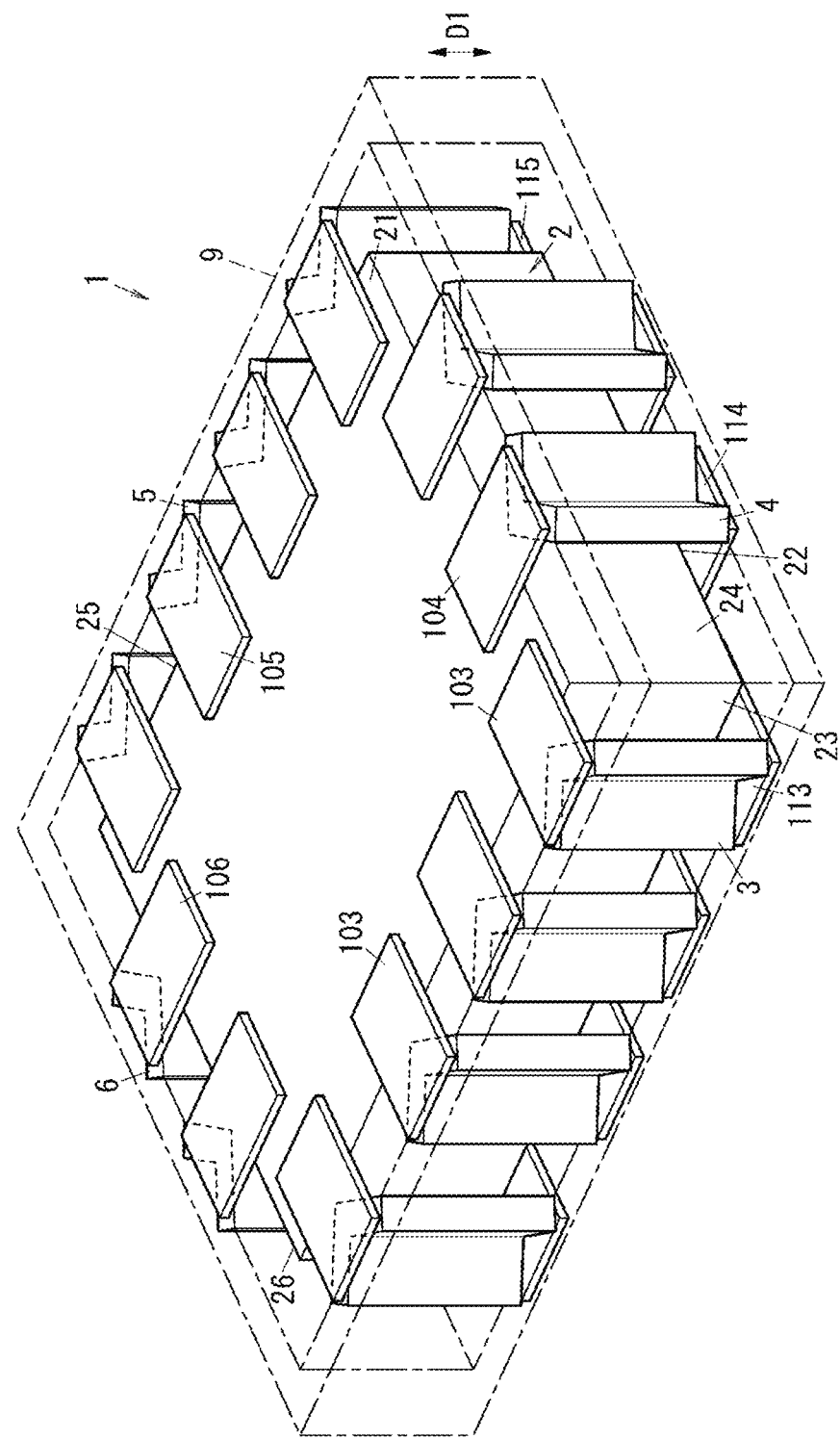
FIG. 3 is a perspective view of the electronic component in FIG. 1.
Figure 4:
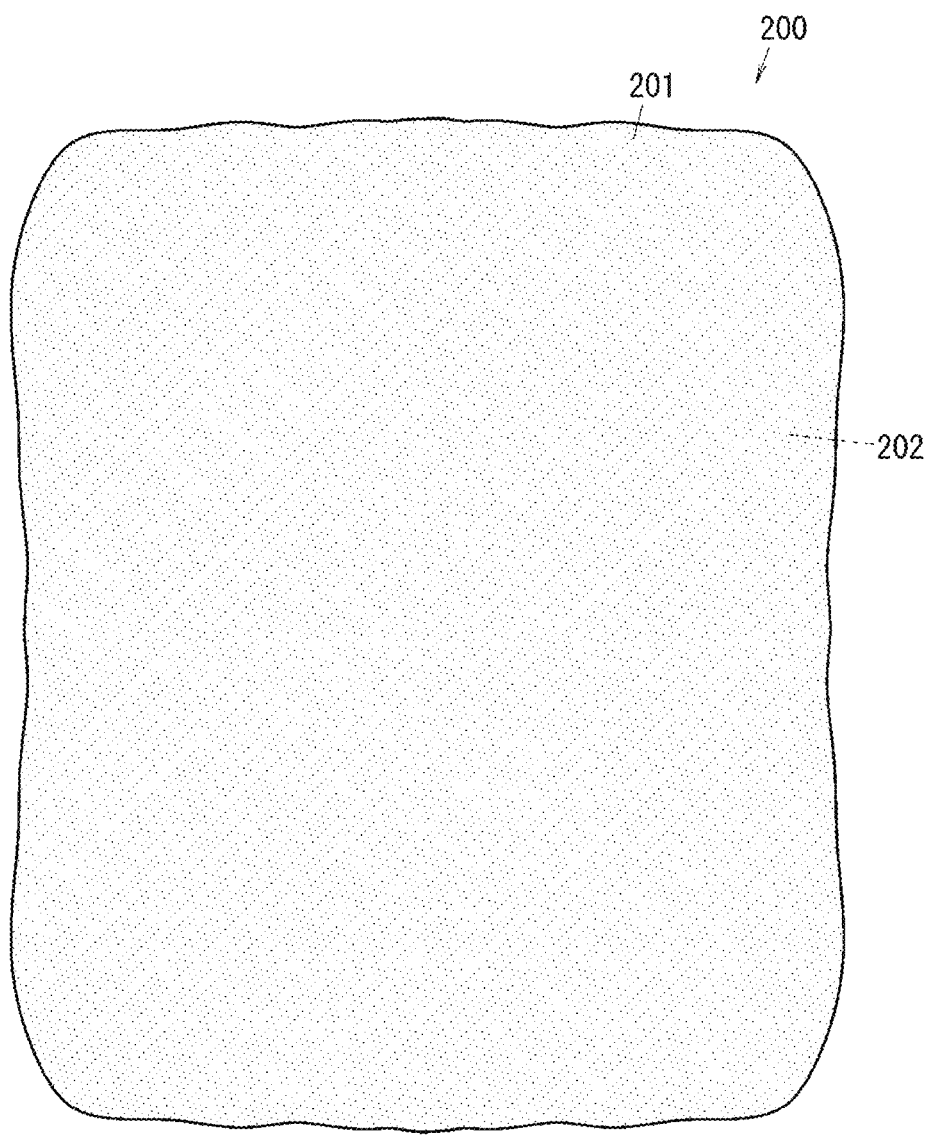
FIG. 4 is a process plan view for illustrating a manufacturing method for an electronic component according to a preferred embodiment of the present invention.
Figure 5:
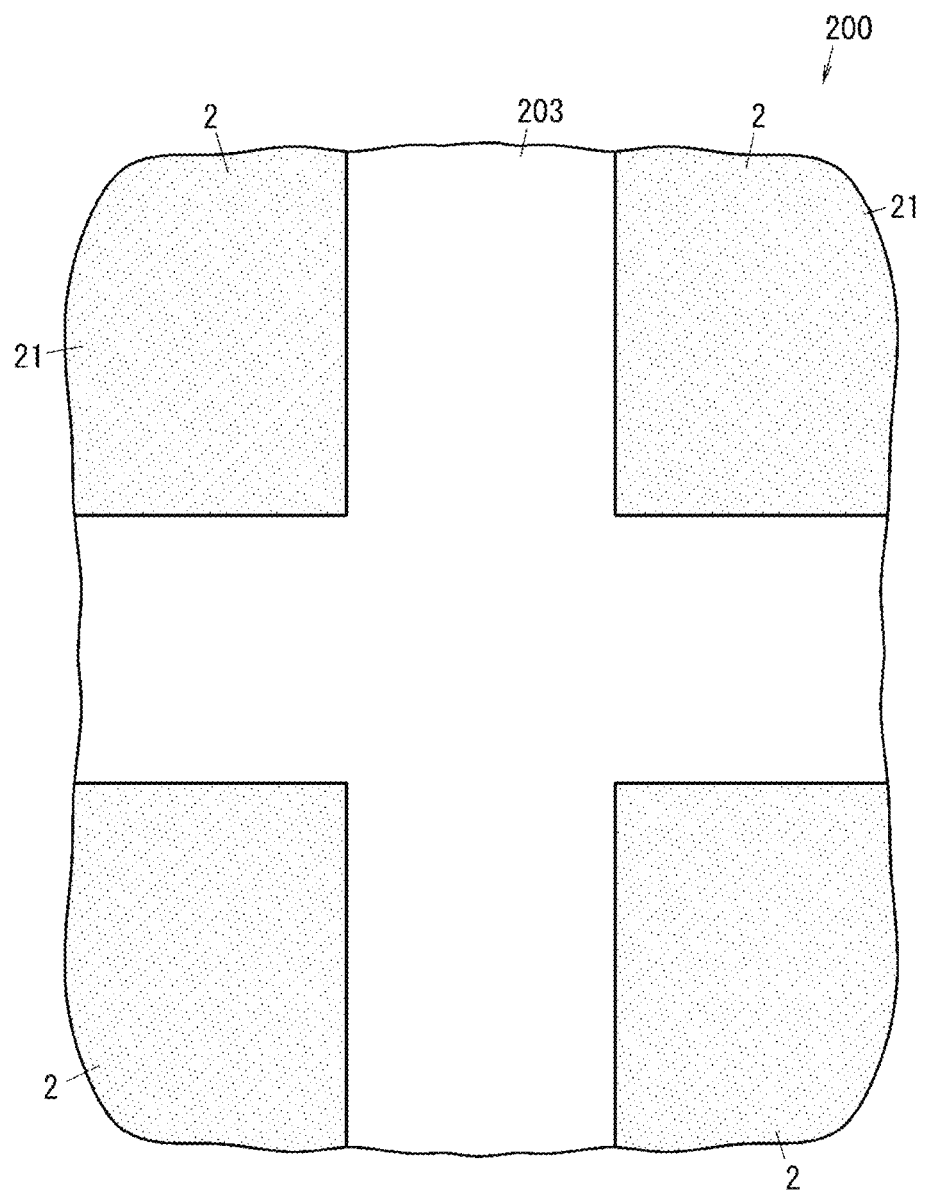
FIG. 5 is a process plan view for illustrating a manufacturing method for an electronic component according to a preferred embodiment of the present invention.
Figure 6:
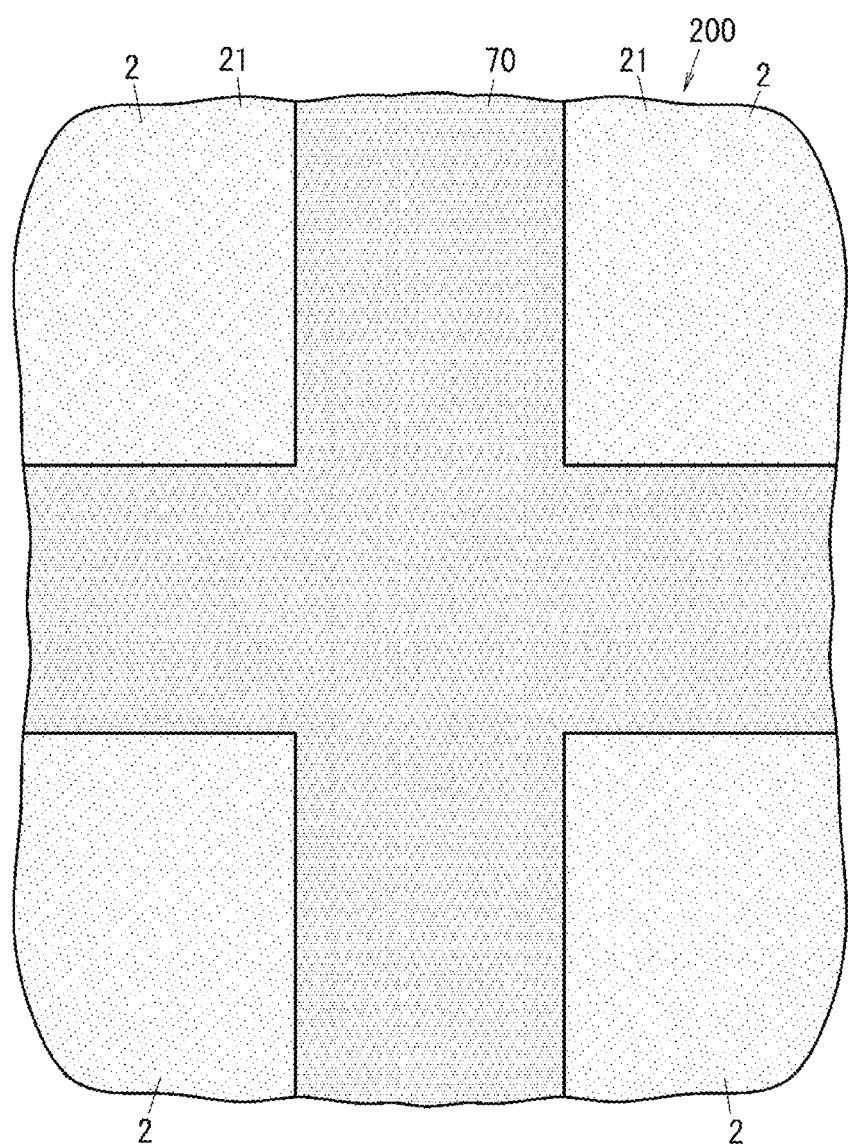
FIG. 6 is a process plan view for illustrating a manufacturing method for an electronic component according to a preferred embodiment of the present invention.
Figure 7:
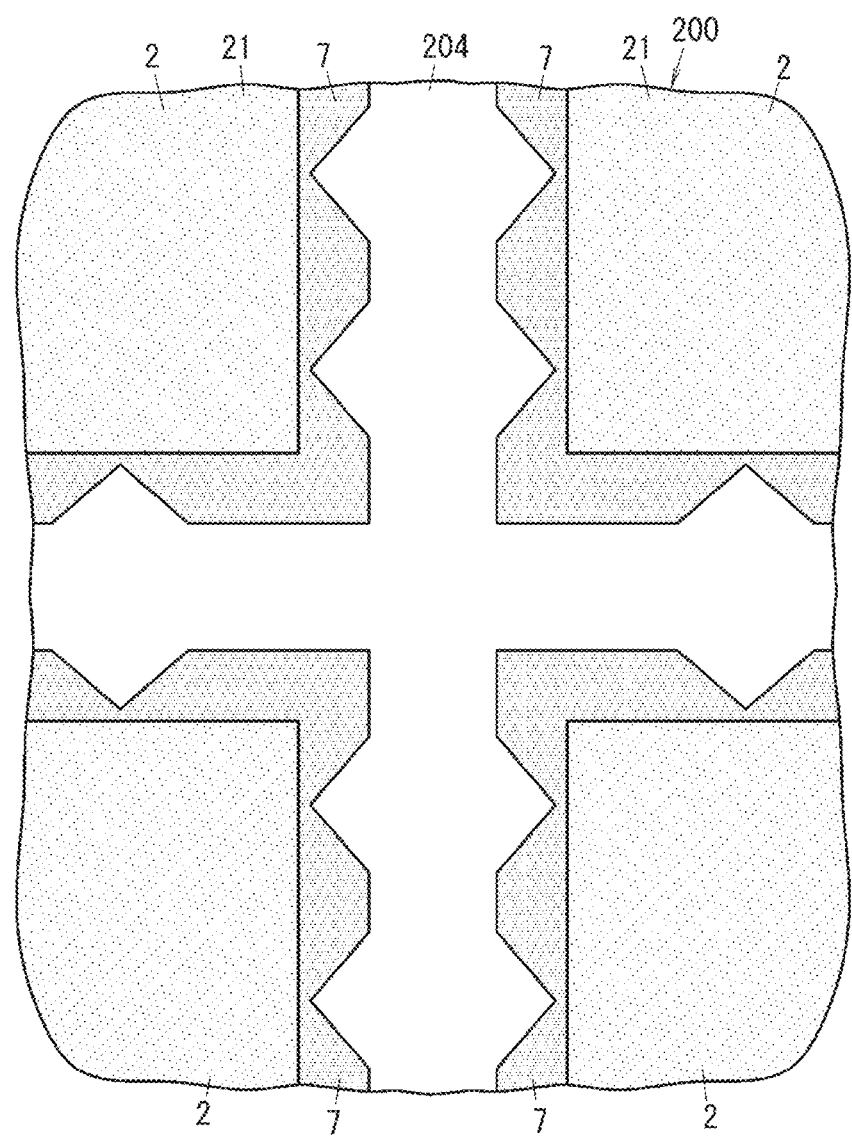
FIG. 7 is a process plan view for illustrating a manufacturing method for an electronic component according to a preferred embodiment of the present invention.
Figure 8:
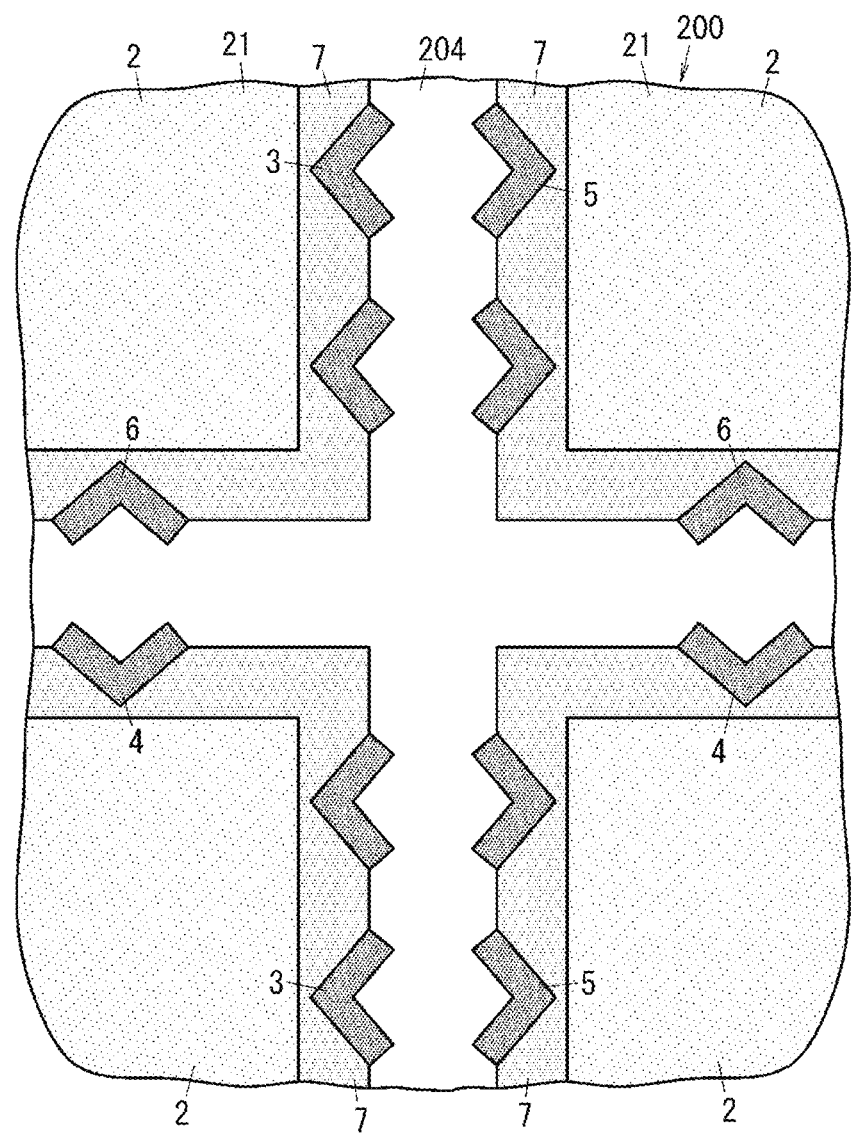
FIG. 8 is a process plan view for illustrating a manufacturing method for an electronic component according to a preferred embodiment of the present invention.
Figure 9:
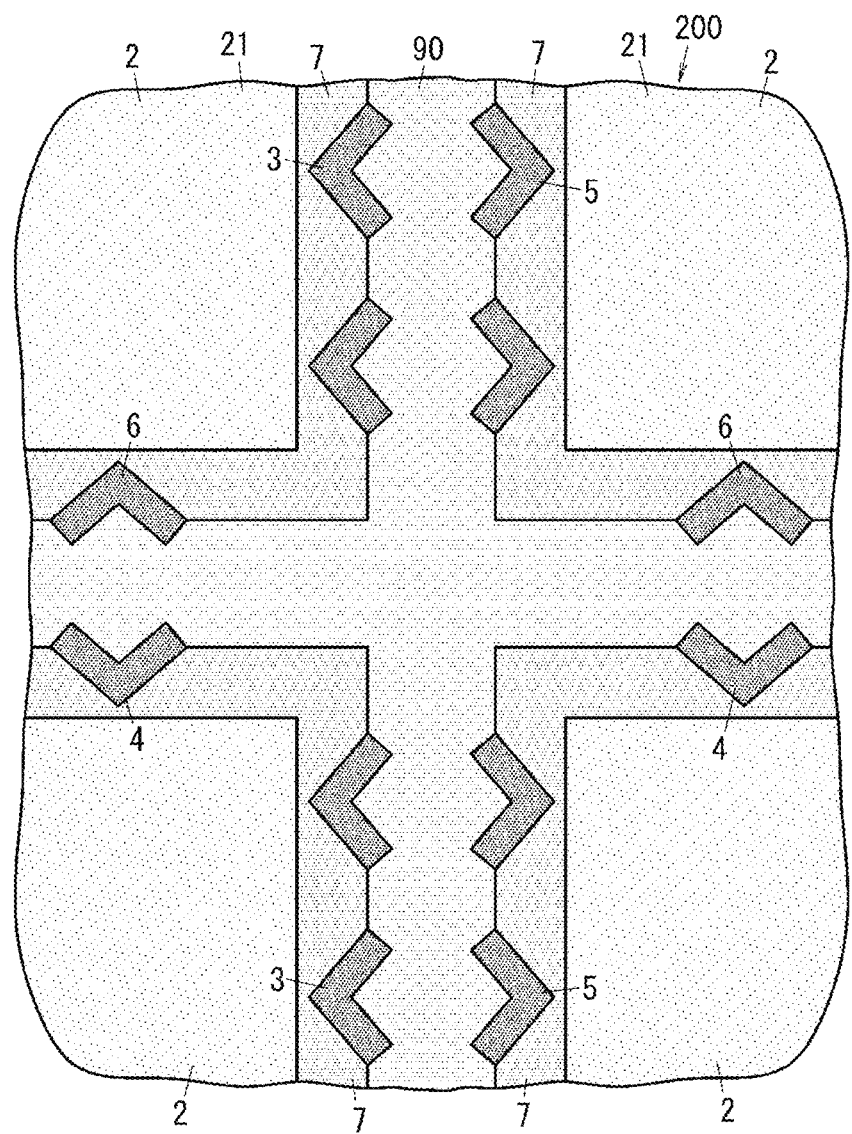
FIG. 9 is a process plan view for illustrating a manufacturing method for an electronic component according to a preferred embodiment of the present invention.
Figure 10:
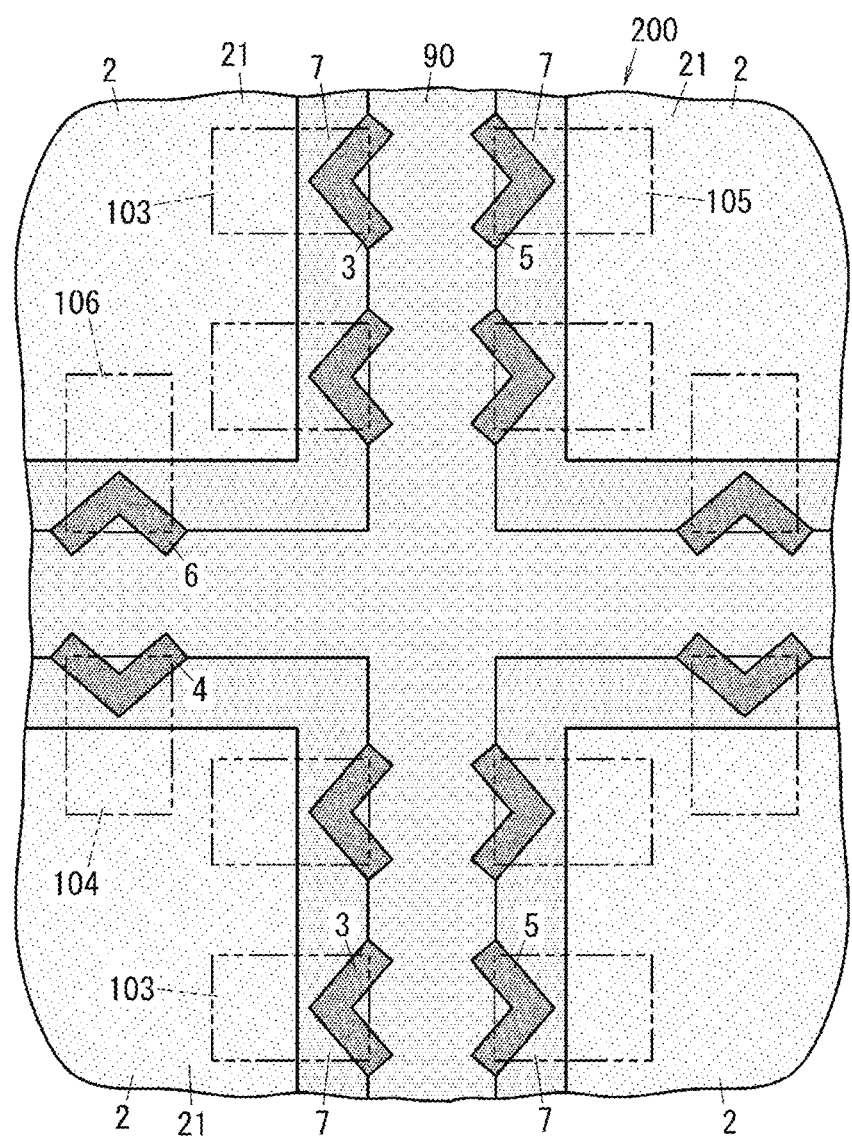
FIG. 10 is a process plan view for illustrating a manufacturing method for an electronic component according to a preferred embodiment of the present invention.
Figure 11:
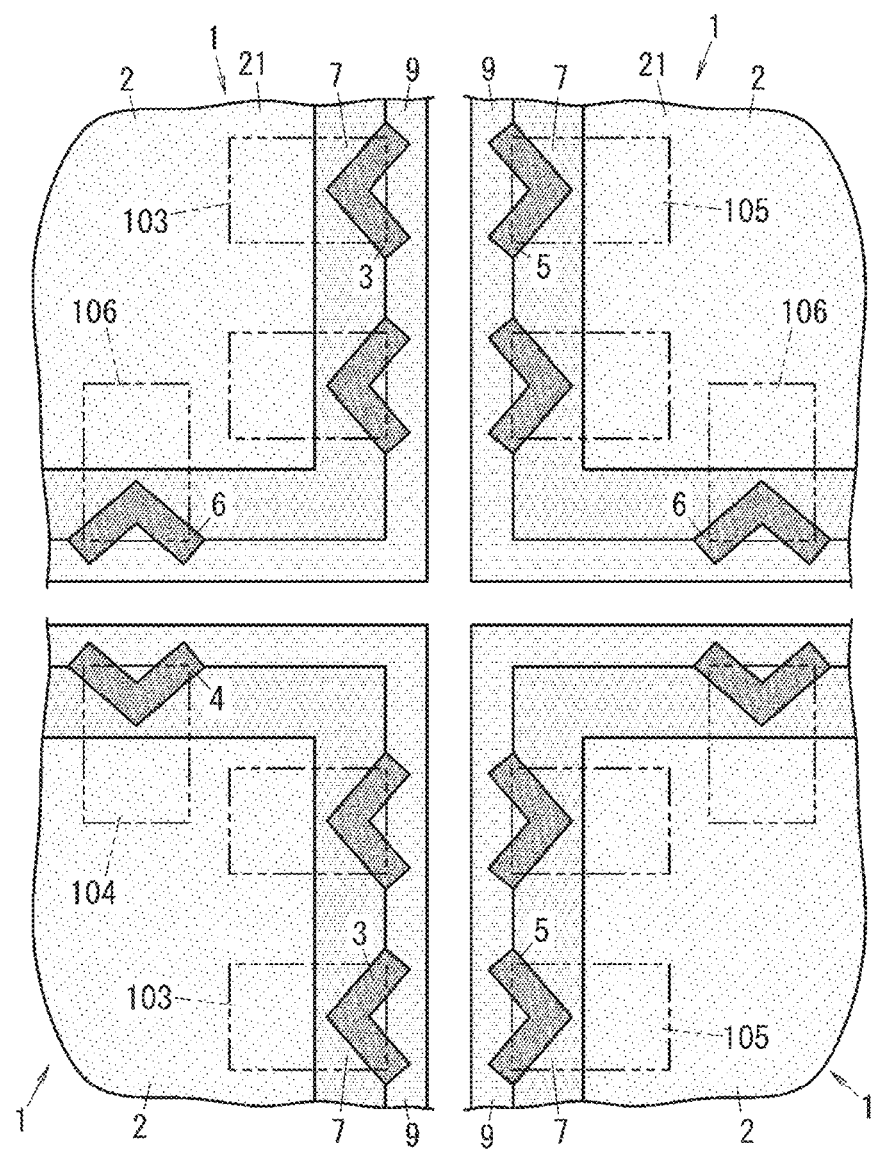
FIG. 11 is a process plan view for illustrating a manufacturing method for an electronic component according to a preferred embodiment of the present invention.

The electronic component 1 according to the first preferred embodiment includes a substrate 2, a plurality of (for example, four) side wires 3, a plurality of (for example, two) side wires 4, a plurality of (for example, four) side wires 5, a plurality of (for example, two) side wires 6, and an electrically insulating layer 7. The electrically insulating layer 7 is interposed between the substrate 2 and each of the plurality of side wires 3, the plurality of side wires 4, the plurality of side wires 5, and the plurality of side wires 6. The electronic component 1 according to the first preferred embodiment includes a plurality of (for example, four) functional portions 8 (see FIGS. 2A to 2D). In FIG. 1 and FIG. 3, the functional portions 8 are not shown.

(2) Component Elements of Electronic Component

The electronic component 1 is, for example, an acoustic wave device including an interdigital transducer electrode defining each of the functional portions 8.

(2.1) Substrate

The substrate 2 includes a first major surface 21 and a second major surface 22 that are on opposite sides in a thickness direction D1 of the substrate 2. The first major surface 21 and the second major surface 22 are opposed to each other. The outer peripheral shape of the substrate 2 when the substrate 2 is viewed in the thickness direction D1 is a rectangular or substantially rectangular shape. Here, the substrate 2 includes four side surfaces 23 to 26 that connect the first major surface 21 and the second major surface 22. In the substrate 2, of the four side surfaces 23 to 26, the two side surfaces 23, 25 are parallel or substantially parallel to each other, and the remaining two side surfaces 24, 26 are parallel or substantially parallel to each other. The length of each of the two side surfaces 23, 25 in a direction along the outer periphery of the substrate 2 is longer than the length of each of the two side surfaces 24, 26. The outer peripheral shape of the substrate 2 is not limited to a rectangular or substantially rectangular shape and may be, for example, a square shape. The thickness of the substrate 2 is, for example, greater than or equal to about 100 μm.

The substrate 2 is, for example, a piezoelectric substrate. The piezoelectric substrate is, for example, a lithium niobate ($LiNbO_3$) substrate. However, the configuration is not limited thereto. The piezoelectric substrate may be, for example, a lithium tantalate ($LiTaO_3$) substrate, a quartz crystal substrate, or the like.

(2.2) Functional Portion

In the electronic component 1, the plurality of (for example, four) functional portions 8 are provided on the first major surface 21 of the substrate 2. The number of the functional portions 8 is not limited to four and may be five or more or may be one, two, or three.

Each of the plurality of functional portions 8 is an interdigital transducer electrode and is provided on the first major surface 21 of the substrate 2. The material of the interdigital transducer electrode is, for example, aluminum (Al), copper (Cu), platinum (Pt), gold (Au), silver (Ag), titanium (Ti), nickel (Ni), chromium (Cr), molybdenum (Mo), tungsten (W), or an alloy including any one of these metals as a main ingredient. Alternatively, the interdigital transducer electrode may have a multilayer structure including a plurality of layers each made of any one of these metals and alloys is laminated. In the electronic component 1 according to the first preferred embodiment, when the wavelength of an acoustic wave, which is determined by the electrode finger pitch of the interdigital transducer electrode, is λ, the thickness of the substrate 2 is preferably greater than or equal to 10λ.

In the electronic component 1, when the plurality of interdigital transducer electrodes is provided, for example, a filter may be provided by electrically connecting a plurality of surface acoustic wave resonators each including the plurality of interdigital transducer electrodes. The filter is, for example, a band pass filter. The filter may be, for example, a transmission filter or may be a receiving filter. The transmission filter and the receiving filter are, for example, band pass filters. However, the configuration is not limited thereto. The transmission filter and the receiving filter may be, for example, high pass filters.

(2.3) Side Wire

The electronic component 1 includes the plurality of (for example, four) side wires 3 indirectly provided on the side surface 23 of the substrate 2, the plurality of (for example, two) side wires 4 indirectly provided on the side surface 24 of the substrate 2, the plurality of (for example, four) side wires 5 indirectly provided on the side surface 25 of the substrate 2, and the plurality of side wires 6 indirectly provided on the side surface 26 (for example, two) of the substrate 2. The plurality of side wires 3, the plurality of side wires 4, the plurality of side wires 5, and the plurality of side wires 6 are arranged along the outer periphery of the substrate 2 when viewed in plan in the thickness direction D1 of the substrate 2. In the electronic component 1, the number of side wires 3 provided on the side surface 23 of the substrate 2 and the number of side wires 5 provided on the side surface 25 of the substrate 2 are the same. However, the configuration is not limited thereto. The number of side wires 3 provided on the side surface 23 of the substrate 2 and the number of side wires 5 provided on the side surface 25 of the substrate 2 may be different from each other. In the electronic component 1, the number of side wires 4 provided on the side surface 24 of the substrate 2 and the number of side wires 6 provided on the side surface 26 of the substrate 2 are the same. However, the configuration is not limited thereto. The number of side wires 4 provided on the side surface 24 of the substrate 2 and the number of side wires 6 provided on the side surface 26 of the substrate 2 may be different from each other. In each of the side wires 3 to 6, at least a portion of each of the side wires 3 to 6 may be indirectly provided on an associated one of the side surfaces 23 to 26 of the substrate 2. In other words, each of the side wires 3 to 6 may be partially in contact with an associated one of the side surfaces 23 to 26 of the substrate 2. Two or more side wires may be disposed on at least one side surface of the substrate 2. When side wires are provided on, for example, the side surface 23, side wires do not need to be provided on the other side surfaces 24 to 26.

The plurality of side wires 3 are spaced apart from each other in the direction along the outer periphery of the substrate 2 when viewed in plan in the thickness direction D1 of the substrate 2. The plurality of side wires 3 are, for example, arranged at equal or substantially equal intervals in the direction along the outer periphery of the substrate 2 (here, the longitudinal direction of the side surface 23 of the substrate 2). Here, the phrase "equal intervals" does not need to be strictly the same intervals and may be, for example, intervals within a first prescribed range. Alternatively, the plurality of side wires 3 may be, for example, arranged at unequal intervals in the direction along the outer periphery of the substrate 2. The plurality of side wires 4 are spaced apart from each other in the direction along the outer periphery of the substrate 2 when viewed in plan in the thickness direction D1 of the substrate 2. The plurality of side wires 5 are spaced apart from each other in the direction along the outer periphery of the substrate 2 when viewed in plan in the thickness direction D1 of the substrate 2. The plurality of side wires 5 are, for example, arranged at equal or substantially equal intervals in the direction along the outer periphery of the substrate 2 (here, the longitudinal direction of the side surface 25 of the substrate 2). Here, the phrase "equal intervals" does not need to be strictly the same intervals and may be, for example, intervals within a second prescribed range. Alternatively, the plurality of side wires 5 may be, for example, arranged at unequal intervals in the direction along the outer periphery of the substrate 2. The plurality of side wires 6 are spaced apart from each other in the direction along the outer periphery of the substrate 2 when viewed in plan in the thickness direction D1 of the substrate 2.

The plurality of side wires 3, the plurality of side wires 4, the plurality of side wires 5, and the plurality of side wires 6 have electrical conductivity. The material of the plurality of side wires 3, the plurality of side wires 4, the plurality of side wires 5, and the plurality of side wires 6 is, for example, copper, silver, nickel, gold, palladium, platinum, aluminum, tin, or an alloy including any one of these metals as a main ingredient.

Each of the plurality of side wires 3 includes a bent portion 33 bent when viewed in plan in the thickness direction D1 of the substrate 2. Each of the plurality of side wires 3 has a V-shape when viewed in plan in the thickness direction D1 of the substrate 2. More specifically, each of the plurality of side wires 3 has a V-shape that opens on the side opposite from the substrate 2 side when viewed in plan in the thickness direction D1 of the substrate 2. The plurality of side wires 3 include a first side wire 31 and a second side wire 32 adjacent to each other in the direction along the outer periphery of the substrate 2. Here, one of the adjacent two side wires 3 is referred to as first side wire 31, and the other one is referred to as second side wire 32. The first side wire 31 includes a plurality of surfaces that intersect with the thickness direction of the first side wire 31. The second side wire 32 includes a plurality of surfaces that intersect with the thickness direction of the second side wire 32. In the electronic component 1, a surface 311 of the plurality of surfaces, opposed to the second side wire 32, in the first side wire 31 and a surface 321 of the plurality of surfaces, opposed to the first side wire 31, in the second side wire 32 are not parallel to each other. In the electronic component 1, the plurality of side wires 3 have the same or substantially the same shape. However, the configuration is not limited thereto. For example, two-type side wires 3 having mutually different shapes may be mixedly included or the plurality of side wires 3 may have mutually different shapes.

Each of the plurality of side wires 4 includes a bent portion 43 bent when viewed in plan in the thickness direction D1 of the substrate 2. Each of the plurality of side wires 4 has a V-shape when viewed in plan in the thickness direction D1 of the substrate 2. More specifically, each of the plurality of side wires 4 has a V-shape that opens on the side opposite from the substrate 2 side when viewed in plan in the thickness direction D1 of the substrate 2. The plurality of side wires 4 include a first side wire 41 and a second side wire 42 adjacent to each other in the direction along the outer periphery of the substrate 2. Here, one of the adjacent two side wires 4 is referred to as first side wire 41, and the other one is referred to as second side wire 42. The first side wire 41 includes a plurality of surfaces that intersect with the thickness direction of the first side wire 41. The second side wire 42 includes a plurality of surfaces that intersect with the thickness direction of the second side wire 42. In the electronic component 1, a surface 411 of the plurality of surfaces, opposed to the second side wire 42, in the first side wire 41 and a surface 421 of the plurality of surfaces, opposed to the first side wire 41, in the second side wire 42 are not parallel to each other. The plurality of side wires 4 have the same or substantially the same shape as the plurality of side wires 3 when viewed in plan in the thickness direction D1 of the substrate 2. However, the configuration is not limited thereto. The plurality of side wires 4 may have a shape different from the plurality of side wires 3.

Each of the plurality of side wires 5 includes a bent portion 53 bent when viewed in plan in the thickness direction D1 of the substrate 2. Each of the plurality of side wires 5 has a V-shape when viewed in plan in the thickness direction D1 of the substrate 2. More specifically, each of the plurality of side wires 5 has a V-shape that opens on the side opposite from the substrate 2 side when viewed in plan in the thickness direction D1 of the substrate 2. The plurality of side wires 5 includes a first side wire 51 and a second side wire 52 adjacent to each other in the direction along the outer periphery of the substrate 2. Here, one of the adjacent two side wires 5 is referred to as first side wire 51, and the other one is referred to as second side wire 52. The first side wire 51 includes a plurality of surfaces that intersect with the thickness direction of the first side wire 51. The second side wire 52 includes a plurality of surfaces that intersect with the thickness direction of the second side wire 52. In the electronic component 1, a surface 511 of the plurality of surfaces, opposed to the second side wire 52, in the first side wire 51 and a surface 521 of the plurality of surfaces, opposed to the first side wire 51, in the second side wire 52 are not parallel to each other. The plurality of side wires 5 have the same or substantially the same shape as the plurality of side wires 3 when viewed in plan in the thickness direction D1 of the substrate 2. However, the configuration is not limited thereto. The plurality of side wires 5 may have a shape different from the plurality of side wires 3.

Each of the plurality of side wires 6 includes a bent portion 63 bent when viewed in plan in the thickness direction D1 of the substrate 2. Each of the plurality of side wires 6 has a V-shape when viewed in plan in the thickness direction D1 of the substrate 2. More specifically, each of the plurality of side wires 6 has a V-shape that opens on the side opposite from the substrate 2 side when viewed in plan in the thickness direction D1 of the substrate 2. The plurality of side wires 6 includes a first side wire 61 and a second side wire 62 adjacent to each other in the direction along the outer periphery of the substrate 2. Here, one of the adjacent two side wires 6 is referred to as first side wire 61, and the other one is referred to as second side wire 62. The first side wire 61 includes a plurality of surfaces that intersect with the thickness direction of the first side wire 61. The second side wire 62 includes a plurality of surfaces that intersect with the thickness direction of the second side wire 62. In the electronic component 1, a surface 611 of the plurality of surfaces, opposed to the second side wire 62, in the first side wire 61 and a surface 621 of the plurality of surfaces, opposed to the first side wire 61, in the second side wire 62 are not parallel to each other. The plurality of side wires 6 have the same or substantially the same shape as the plurality of side wires 3 when viewed in plan in the thickness direction D1 of the substrate 2. However, the configuration is not limited thereto. The plurality of side wires 5 may have a shape different from the plurality of side wires 3.

(2.4) Electrically Insulating Layer

The electronic component 1 includes the electrically insulating layer 7 (hereinafter, also referred to as first electrically insulating layer 7) interposed between the substrate 2 and each of the plurality of side wires 3, the plurality of side wires 4, the plurality of side wires 5, and the plurality of side wires 6. The first electrically insulating layer 7 is, for example, provided over the four side surfaces 23 to 26 of the substrate 2. The first electrically insulating layer 7 has electrical insulating properties. The material of the first electrically insulating layer 7 is, for example, a resin, such as epoxy resin and polyimide resin. Therefore, in the electronic component 1 according to the first preferred embodiment, the first electrically insulating layer 7 is, for example, a resin layer. The dielectric constant of the first electrically insulating layer 7 is preferably lower than the dielectric constant of the substrate 2. The dielectric constant of the first electrically insulating layer 7 is, for example, about 1.5 to about 5. The material of the first electrically insulating layer 7 is not limited to an organic material, such as a resin, and may be, for example, an inorganic material.

(2.5) Second Electrically Insulating Layer

The electronic component 1 includes a second electrically insulating layer 9 that covers the plurality of side wires 3, the plurality of side wires 4, the plurality of side wires 5, and the plurality of side wires 6 on the first electrically insulating layer 7. Here, the second electrically insulating layer 9 covers the plurality of side wires 3, the plurality of side wires 4, the plurality of side wires 5, and the plurality of side wires 6 on the side of the plurality of side wires 3, the plurality of side wires 4, the plurality of side wires 5, and the plurality of side wires 6, opposite from the side on which the first electrically insulating layer 7 is provided. The second electrically insulating layer 9 has electrical insulating properties. The material of the second electrically insulating layer 9 is, for example, a resin, such as epoxy resin and polyimide resin. The material of the second electrically insulating layer 9 may be the same as the material of the first electrically insulating layer 7 or may be different from the material of the first electrically insulating layer 7. The material of the second electrically insulating layer 9 is not limited to an organic material, such as a resin, and may be, for example, an inorganic material.

(2.6) Wiring Portion

The electronic component 1 includes a plurality of wiring portions 103 connected in one-to-one correspondence with the plurality of side wires 3. Each of the plurality of wiring portions 103 overlaps a portion of the substrate 2 and at least a portion of an associated one of the plurality of side wires 3 when viewed in plan in the thickness direction D1 of the substrate 2. Each of the plurality of wiring portions 103 includes a first end 131 located outside the outer periphery of the substrate 2 and a second end 132 located inside the outer periphery of the substrate 2 when viewed in plan in the thickness direction D1 of the substrate 2. In each of the plurality of wiring portions 103, a portion located inside the outer periphery of the substrate 2 when viewed in plan in the thickness direction D1 of the substrate 2 and including the second end 132 is, for example, directly or indirectly provided on the first major surface 21 of the substrate 2.

The electronic component 1 includes a plurality of wiring portions 104 connected in one-to-one correspondence with the plurality of side wires 4. Each of the plurality of wiring portions 104 overlaps a portion of the substrate 2 and at least a portion of an associated one of the plurality of side wires 4 when viewed in plan in the thickness direction D1 of the substrate 2. Each of the plurality of wiring portions 104 includes a first end 141 located outside the outer periphery of the substrate 2 and a second end 142 located inside the outer periphery of the substrate 2 when viewed in plan in the thickness direction D1 of the substrate 2. In each of the plurality of wiring portions 104, a portion located inside the outer periphery of the substrate 2 when viewed in plan in the thickness direction D1 of the substrate 2 and including the second end 142 is, for example, directly or indirectly provided on the first major surface 21 of the substrate 2.

The electronic component 1 includes a plurality of wiring portions 105 connected in one-to-one correspondence with the plurality of side wires 5. Each of the plurality of wiring portions 105 overlaps a portion of the substrate 2 and at least a portion of an associated one of the plurality of side wires 5 when viewed in plan in the thickness direction D1 of the substrate 2. Each of the plurality of wiring portions 105 includes a first end 151 located outside the outer periphery of the substrate 2 and a second end 152 located inside the outer periphery of the substrate 2 when viewed in plan in the thickness direction D1 of the substrate 2. In each of the plurality of wiring portions 105, a portion located inside the outer periphery of the substrate 2 when viewed in plan in the thickness direction D1 of the substrate 2 and including the second end 152 is, for example, directly or indirectly provided on the first major surface 21 of the substrate 2.

The electronic component 1 includes a plurality of wiring portions 106 connected in one-to-one correspondence with the plurality of side wires 6. Each of the plurality of wiring portions 106 overlaps a portion of the substrate 2 and at least a portion of an associated one of the plurality of side wires 6 when viewed in plan in the thickness direction D1 of the substrate 2. Each of the plurality of wiring portions 106 includes a first end 161 located outside the outer periphery of the substrate 2 and a second end 162 located inside the outer periphery of the substrate 2 when viewed in plan in the thickness direction D1 of the substrate 2. In the plurality of wiring portions 106, a portion located inside the outer periphery of the substrate 2 when viewed in plan in the thickness direction D1 of the substrate 2 and including the second end 162 is, for example, directly or indirectly provided on the first major surface 21 of the substrate 2.

The material of the plurality of wiring portions 103, the plurality of wiring portions 104, the plurality of wiring portions 105, and the plurality of wiring portions 106 is, for example, copper, silver, nickel, gold, palladium, platinum, aluminum, tin, or an alloy including any one of these metals as a main ingredient. However, the configuration is not limited thereto. The material of the plurality of wiring portions 103, the plurality of wiring portions 104, the plurality of wiring portions 105, and the plurality of wiring portions 106 may have, for example, a multilayer structure including a plurality of layers each made of any one of these metals or alloys is laminated.

The plurality of wiring portions 103, the plurality of wiring portions 104, the plurality of wiring portions 105, and the plurality of wiring portions 106 are electrically connected to, for example, any one of the plurality of functional portions 8, or the like. In the electronic component 1, the wiring portion 103 and the functional portion 8 associated with the wiring portion 103 are electrically connected via a wire 173 (see FIG. 2A) provided on the first major surface 21 of the substrate 2. Alternatively, the wiring portion 103 and the functional portion 8 may be directly electrically connected without intervening the wire 173. In the electronic component 1, the wiring portion 104 and the functional portion 8 associated with the wiring portion 104 are electrically connected via a wire 174 (see FIG. 2B) provided on the first major surface 21 of the substrate 2. Alternatively, the wiring portion 104 and the functional portion 8 may be directly electrically connected without intervening the wire 174. In the electronic component 1, the wiring portion 105 and the functional portion 8 associated with the wiring portion 105 are electrically connected via a wire 175 (see FIG. 2C) provided on the first major surface 21 of the substrate 2. Alternatively, the wiring portion 105 and the functional portion 8 may be directly electrically connected without intervening the wire 175. In the electronic component 1, the wiring portion 106 and the functional portion 8 associated with the wiring portion 106 are electrically connected via a wire 176 (see FIG. 2D) provided on the first major surface 21 of the substrate 2. Alternatively, the wiring portion 106 and the functional portion 8 may be directly electrically connected without intervening the wire 176.

The electronic component 1 includes a plurality of wiring portions 113 (see FIG. 2A and FIG. 3) connected in one-to-one correspondence with the plurality of side wires 3 on the second major surface 22 side of the substrate 2. Each of the plurality of wiring portions 113 overlaps a portion of the substrate 2 and at least a portion of an associated one of the plurality of side wires 3 when viewed in plan in the thickness direction D1 of the substrate 2.

The electronic component 1 includes a plurality of wiring portions 114 (see FIG. 2B and FIG. 3) connected in one-to-one correspondence with the plurality of side wires 4 on the second major surface 22 side of the substrate 2. Each of the plurality of wiring portions 114 overlaps a portion of the substrate 2 and at least a portion of an associated one of the plurality of side wires 4 when viewed in plan in the thickness direction D1 of the substrate 2.

The electronic component 1 includes a plurality of wiring portions 115 (see FIG. 2C and FIG. 3) connected in one-to-one correspondence with the plurality of side wires 5 on the second major surface 22 side of the substrate 2. Each of the plurality of wiring portions 115 overlaps a portion of the substrate 2 and at least a portion of an associated one of the plurality of side wires 5 when viewed in plan in the thickness direction D1 of the substrate 2.

The electronic component 1 includes a plurality of wiring portions 116 (see FIG. 2D) connected in one-to-one correspondence with the plurality of side wires 6 on the second major surface 22 side of the substrate 2. Each of the plurality of wiring portions 116 overlaps a portion of the substrate 2 and at least a portion of an associated one of the plurality of side wires 6 when viewed in plan in the thickness direction D1 of the substrate 2.

The plurality of wiring portions 103 to 106, 113 to 116 do not need to be connected in one-to-one correspondence with the plurality of side wires 3 to 6. In other words, two or more of the plurality of wiring portions 103 to 106, 113 to 116 may be connected to one side wire. The plurality of wiring portions 103 to 106, 113 to 116 may be included in the functional portions.

(3) Manufacturing Method for Electronic Component

Hereinafter, a non-limiting example of a manufacturing method for the electronic component 1 will be described with reference to FIG. 4 to FIG. 11.

Initially, a wafer preparation step of preparing a wafer 200 (see FIG. 4) including one major surface 201 and another major surface 202 is performed. In the wafer preparation step, a wafer in which the plurality of functional portions 8 (see FIGS. 2A to 2D) and the like are formed in each of regions respectively associated with a plurality of the electronic components 1 on the one major surface 201 is prepared as the wafer 200. The one major surface 201 of the wafer 200 includes the first major surfaces 21 of a plurality of the substrates 2 (see FIG. 1). The other major surface 202 of the wafer 200 includes the second major surfaces 22 of the plurality of substrates 2.

After the wafer preparation step, for example, a slit formation step of preparing a support member including a support and an adhesion layer on the support, bonding the wafer 200 to the support member, and then forming a grid-shaped slits 203 (see FIG. 5) for splitting the wafer 200 into individual substrates 2 with a dicing technique or an etching technique is performed. The adhesion layer is made of, for example, an acrylic adhesive material.

After the slit formation step, a first electrically insulating portion formation step of forming a first electrically insulating portion 70 (see FIG. 6) that is the source of the first electrically insulating layers 7 of the plurality of electronic components 1 in the grid-shaped slits 203 is performed. In the first electrically insulating portion formation step, for example, the first electrically insulating portion 70 is formed by, for example, applying a photosensitive resin material and drying the photosensitive resin material.

After the first electrically insulating portion formation step, a first electrically insulating layer formation step of forming a plurality of the first electrically insulating layers 7 (see FIG. 7) by patterning the first electrically insulating portion 70 is performed. In the first electrically insulating layer formation step, for example, the first electrically insulating portion 70 is patterned with a photolithography technique. More specifically, in the first electrically insulating layer formation step, grid-shaped slits 204 (see FIG. 7) narrower in width than the slits 203 are formed in the first electrically insulating portion 70. In the first electrically insulating layer formation step, not limited to the photolithography technique, the first electrically insulating portion 70 may be patterned with, for example, a wet or dry etching technique, a dicing technique, a drilling technique, or the like.

After the first electrically insulating layer formation step, a side wire formation step of forming the plurality of side wires 3, the plurality of side wires 4, the plurality of side wires 5, and the plurality of side wires 6 (see FIG. 8) on each of the plurality of substrates 2 is performed. In the side wire formation step, the plurality of side wires 3, the plurality of side wires 4, the plurality of side wire 5, and the plurality of side wires 6 are formed with, for example, a sputtering technique, a plating technique, application or filling of electrically conductive paste, a lithography technique, and the like. For patterning the plurality of side wires 3, the plurality of side wires 4, the plurality of side wires 5, and the plurality of side wires 6, for example, appropriate masking may be applied in advance on the substrate 2 and the first electrically insulating layer 7, and then the plurality of side wires 3, the plurality of side wires 4, the plurality of side wires 5, and the plurality of side wires 6 may be formed. Alternatively, for patterning the plurality of side wires 3, the plurality of side wires 4, the plurality of side wires 5, and the plurality of side wires 6, for example, a metal film that is the source of the plurality of side wires 3, the plurality of side wires 4, the plurality of side wires 5, and the plurality of side wires 6 may be formed, necessary portions of the metal film may be masked, and then unnecessary portions of the metal film may be removed by etching.

After the side wire formation step, a second electrically insulating portion formation step of forming a second electrically insulating portion 90 (see FIG. 9) that is the source of the second electrically insulating layers 9 of the plurality of electronic components 1 in the grid-shaped slits 204 is performed. In the second electrically insulating portion formation step, for example, the second electrically insulating portion 90 is formed by applying a resin material and then curing the resin material. For example, a photosensitive resin material may be used as the resin material used in the second electrically insulating portion formation step.

Alternatively, in the second electrically insulating portion formation step, for example, the second electrically insulating portion 90 may be formed by disposing a resin sheet that is the source of the second electrically insulating portion 90.

After the second electrically insulating portion formation step, a first wiring portion formation step of forming first wiring portions including the plurality of wiring portions 103, the plurality of wiring portions 104, the plurality of wiring portions 105, and the plurality of wiring portions 106 (see FIG. 10) on the first major surface 21 side of each of the plurality of substrates 2 is performed.

After the first wiring portion formation step, a support member removal step of removing the support member is performed.

After the support member removal step, a second wiring portion formation step of forming second wiring portions including the plurality of wiring portions 113, the plurality of wiring portions 114, the plurality of wiring portions 115, and the plurality of wiring portions 116 (see FIGS. 2A to 2D) on the second major surface 22 side of each of the plurality of substrates 2 is performed.

After the second wiring portion formation step, a second electrically insulating layer formation step of forming a plurality of the second electrically insulating layers 9 (see FIG. 11) by patterning the second electrically insulating portion 90 is performed. In the second electrically insulating layer formation step, for example, the second electrically insulating portion 90 is patterned with a photolithography technique. In the second electrically insulating layer formation step, not limited to the photolithography technique, the second electrically insulating portion 90 may be patterned with, for example, an etching technique or a dicing technique.

With the manufacturing method for the electronic component 1, the plurality of electronic components 1 are manufactured by performing steps up to the second electrically insulating layer formation step. The above-described manufacturing method for the electronic component 1 is one example and is not limited thereto. For example, with the manufacturing method for the electronic component 1, without preparing the above-described support member, bottomed grooves may be formed instead of the slits 203 and the slits 204, the plurality of first electrically insulating layers 7 and the second electrically insulating portion 90 may be exposed by etching or polishing the wafer 200 from the other major surface 202 such that the wafer 200 is formed into the plurality of substrates 2 with a predetermined thickness after the first wiring portion formation step, then the second wiring portion formation step may be performed, and subsequently the second electrically insulating layer formation step may be performed.

(4) Advantageous Effects

The electronic component 1 according to the first preferred embodiment includes the substrate 2 and the plurality of side wires 3. The substrate 2 includes the first major surface 21, the second major surface 22, and the side surface 23. The plurality of side wires 3 is provided on the side surface 23 of the substrate 2 and spaced apart from each other in the direction along the outer periphery of the substrate 2 when viewed in plan in the thickness direction D1 of the substrate 2. The plurality of side wires 3 are indirectly provided on the side surface 23 of the substrate 2. The electronic component 1 further includes the electrically insulating layer 7 interposed between the side surface 23 of the substrate 2 and the at least a portion of each of the plurality of side wires 3. Each of the plurality of side wires 3 includes the bent portion 33 bent when viewed in plan in the thickness direction D1 of the substrate 2. Thus, with the electronic component 1 according to the first preferred embodiment, the number of side wires 3 provided on the side surface 23 of the substrate 2 can be further increased. Similarly, with the electronic component 1 according to the first preferred embodiment, the number of side wires 4 provided on the side surface 24 of the substrate 2, the number of side wires 5 provided on the side surface 25 of the substrate 2, and the number of side wires 6 provided on the side surface 26 of the substrate 2 can be further increased. In the electronic component 1, the plurality of side wires 3, the plurality of side wires 4, the plurality of side wires 5, and the plurality of side wires 6 are respectively indirectly provided on the four side surfaces 23, 24, 25, 26 of the substrate 2. However, the plurality of side wires 3 may be just provided on at least one side surface 23.

Figure 12:
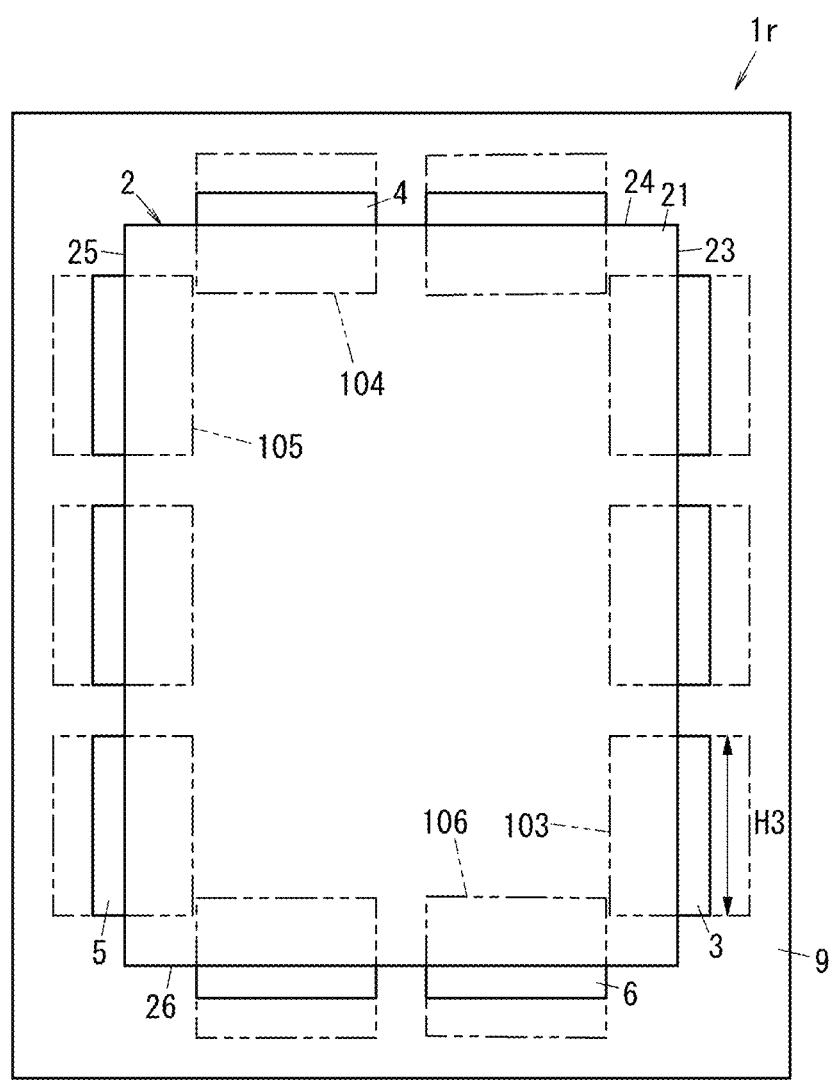
FIG. 12 is a plan view of an electronic component according to a comparative example with a portion cut away.

An electronic component 1r according to a comparative example to the electronic component 1 according to the first preferred embodiment will be described with reference to FIG. 12.

The electronic component 1r according to the comparative example differs from the electronic component 1 according to the first preferred embodiment in the shape and the like of each of the side wires 3 to 6. For the electronic component 1r according to the comparative example, the same reference signs denote component elements the same as or similar to those of the electronic component 1 according to the first preferred embodiment, and the description is omitted.

In the electronic component 1r according to the comparative example, the plurality of (three) side wires 3 are directly provided on the side surface 23 of the substrate 2. In the electronic component 1r according to the comparative example, the plurality of (two) side wires 4 are directly provided on the side surface 24 of the substrate 2, the plurality of (three) side wires 5 are directly provided on the side surface 25 of the substrate 2, and the plurality of (two) side wires 6 are directly provided on the side surface 26 of the substrate 2. In the electronic component 1 according to the first preferred embodiment, the size of the substrate 2 when viewed in plan in the thickness direction D1 of the substrate 2 is the same or substantially the same as the size of the substrate 2 of the electronic component 1r according to the comparative example.

In the electronic component 1r according to the comparative example, each of the side wires 3 has a linear shape along the direction along the outer periphery of the substrate 2 when viewed in plan in the thickness direction D1 of the substrate 2 and includes no bent portion 33 provided in each of the side wires 3 of the electronic component 1 according to the first preferred embodiment. In the electronic component 1r according to the first preferred embodiment, the thickness of each of the side wires 3 when viewed in plan in the thickness direction D1 of the substrate 2 is the same or substantially the same as the thickness of each of the side wires 3 of the electronic component 1r according to the comparative example, and the area of each of the side wires 3 is the same or substantially the same as the area of each of the side wires 3 of the electronic component 1r according to the comparative example. With this configuration, in the electronic component 1r according to the first preferred embodiment, the width H3 of each of the side wires 3 in the direction along the outer periphery of the substrate 2 is shorter than the width H3 of each of the side wires 3 of the electronic component 1r according to the first comparative example. Thus, in the electronic component 1r according to the first preferred embodiment, when the shortest distance between any adjacent two of the plurality of side wires 3 is equal or substantially equal to the shortest distance between any adjacent two of the plurality of side wires 3 of the electronic component 1r according to the comparative example, the number of the side wires 3 provided on the side surface 23 of the substrate 2 can be increased. Similarly, in the electronic component 1 according to the first preferred embodiment, the number of side wires 5 provided on the side surface 25 of the substrate 2 can be increased as compared to the electronic component 1r according to the comparative example. In the electronic component 1 according to the first preferred embodiment, the number of side wires 4 provided on the side surface 24 of the substrate 2 can be increased as compared to the electronic component 1r according to the comparative example. In the electronic component 1 according to the first preferred embodiment, the number of side wires 6 provided on the side surface 26 of the substrate 2 can be increased as compared to the electronic component 1r according to the comparative example. With the electronic component 1 according to the first preferred embodiment, when the number of side wires 6 is the same as that of the electronic component 1r according to the comparative example, the distance between the adjacent side wires 6 can be further increased, so capacitive coupling between the adjacent side wires 6 is further reduced or prevented.

The electronic component 1 according to the first preferred embodiment enables the number of side wires 3 to be increased without shortening the distance between any adjacent side wires 3 as compared to the electronic component 1r according to the comparative example. With this configuration, in the electronic component 1 according to the first preferred embodiment, even when the number of side wires 3 is increased as compared to the electronic component 1r according to the comparative example, capacitive coupling between any adjacent side wires 3 is reduced or prevented. Thus, the electronic component 1 according to the first preferred embodiment is capable of reducing or preventing the deterioration of electrical characteristics (for example, filter characteristics and the like).

In the electronic component 1 according to the first preferred embodiment, the electrically insulating layer 7 is provided on the side surfaces 23 to 26 of the substrate 2, so it is possible to reduce the influence of chipping of each of the side surfaces 23, 24, 25, 26 of the substrate 2 on an associated one of the plurality of side wires 3, the plurality of side wires 4, the plurality of side wires 5, and the plurality of side wires 6. With this configuration, with the electronic component 1 according to the first preferred embodiment, an occurrence of a break in the plurality of side wires 3, the plurality of side wires 4, the plurality of side wires 5, and the plurality of side wires 6 is reduced or prevented. With the electronic component 1 according to the first preferred embodiment, the electrically insulating layer 7 is provided, so, particularly, when the substrate 2 includes a fragile material, an occurrence of chipping in the first major surface 21 and the second major surface 22 of the substrate 2 due to cutting with a dicer or the like is reduced or prevented.

In the electronic component 1 according to the first preferred embodiment, the dielectric constant of the electrically insulating layer 7 is lower than the dielectric constant of the substrate 2. With this configuration, with the electronic component 1 according to the first preferred embodiment, capacitive coupling of the adjacent two side wires 3 via the substrate 2 in the plurality of side wires 3 is reduced or prevented.

In the electronic component 1 according to the first preferred embodiment, the surfaces 311, 321, closest and opposed to each other, of the adjacent first side wire 31 and second side wire 32 of the plurality of side wires 3 are not parallel to each other. With this configuration, with the electronic component 1 according to the first preferred embodiment, capacitive coupling between the adjacent first side wire 31 and second side wire 32 of the plurality of side wires 3 can be reduced or prevented. Similarly, in the electronic component 1 according to the first preferred embodiment, the surfaces 411, 421, closest and opposed to each other, of the adjacent first side wire 41 and second side wire 42 of the plurality of side wires 4 are not parallel to each other. With this configuration, in the electronic component 1 according to the first preferred embodiment, capacitive coupling between the adjacent first side wire 41 and second side wire 42 of the plurality of side wires 4 can be reduced or prevented. Similarly, in the electronic component 1 according to the first preferred embodiment, the surfaces 511, 521, closest and opposed to each other, of the adjacent first side wire 51 and second side wire 52 of the plurality of side wires 5 are not parallel to each other. With this configuration, with the electronic component 1 according to the first preferred embodiment, capacitive coupling between the adjacent first side wire 51 and second side wire 52 of the plurality of side wires 5 can be reduced or prevented. Similarly, in the electronic component 1 according to the first preferred embodiment, the surfaces 611, 621, closest and opposed to each other, of the adjacent first side wire 61 and second side wire 62 of the plurality of side wires 6 are not parallel to each other. With this configuration, with the electronic component 1 according to the first preferred embodiment, capacitive coupling between the adjacent first side wire 61 and second side wire 62 of the plurality of side wires 6 can be reduced or prevented.

In the electronic component 1 according to the first preferred embodiment, each of the plurality of wiring portions 103 connected in one-to-one correspondence with the plurality of side wires 3 overlaps a portion of the substrate 2 and at least a portion of an associated one of the plurality of side wires 3 when viewed in plan in the thickness direction D1 of the substrate 2. With this configuration, with the electronic component 1 according to the first preferred embodiment, connectivity between the plurality of side wires 3 and the functional portions 8 and the like on the substrate 2 is improved. In the electronic component 1 according to the first preferred embodiment, each of the plurality of side wires 3 includes the bent portion 33, so, even when a relative positional deviation occurs between the side wire 3 and the wiring portion 103 when viewed in plan in the thickness direction D1 of the substrate 2, electrical connectivity between the side wire 3 and the wiring portion 103 is easily ensured. With this configuration, the electronic component 1 according to the first preferred embodiment is advantageous in that, when viewed in plan in the thickness direction D1 of the substrate 2, the wiring portions 103 do not need to be redundantly extended away from the substrate 2 beyond the side wires 3. Each of the plurality of wiring portions 103 may overlap a portion of the substrate 2 and the entirety or substantially the entirety of an associated one of the plurality of side wires 3 when viewed in plan in the thickness direction D1 of the substrate 2. The same applies to the plurality of wiring portions 104, the plurality of wiring portions 105, and the plurality of wiring portions 106.

In the electronic component 1 according to the first preferred embodiment, the plurality of side wires 3, the plurality of side wires 4, the plurality of side wires 5, and the plurality of side wires 6 are separated from the outer periphery of the substrate 2 when viewed in plan in the thickness direction D1 of the substrate 2. However, the plurality of side wires 3, the plurality of side wires 4, the plurality of side wires 5, and the plurality of side wires 6 may be in point contact with the substrate 2 when viewed in plan in the thickness direction D1 of the substrate 2. In the electronic component 1 according to the first preferred embodiment, the side wire 3 and the wiring portion 103, associated in one-to-one correspondence with each other, are separately provided and have a boundary between the side wire 3 and the wiring portion 103. However, the configuration is not limited thereto. The side wire 3 and the wiring portion 103, associated in one-to-one correspondence with each other, may be integrally provided. Similarly, in the electronic component 1 according to the first preferred embodiment, the side wire 4 and the wiring portion 104, associated in one-to-one correspondence with each other, may be integrally provided. Similarly, in the electronic component 1 according to the first preferred embodiment, the side wire 5 and the wiring portion 105, associated in one-to-one correspondence with each other, may be integrally provided. Similarly, in the electronic component 1 according to the first preferred embodiment, the side wire 6 and the wiring portion 106, associated in one-to-one correspondence with each other, may be integrally provided.

Second Preferred Embodiment

Figure 13:
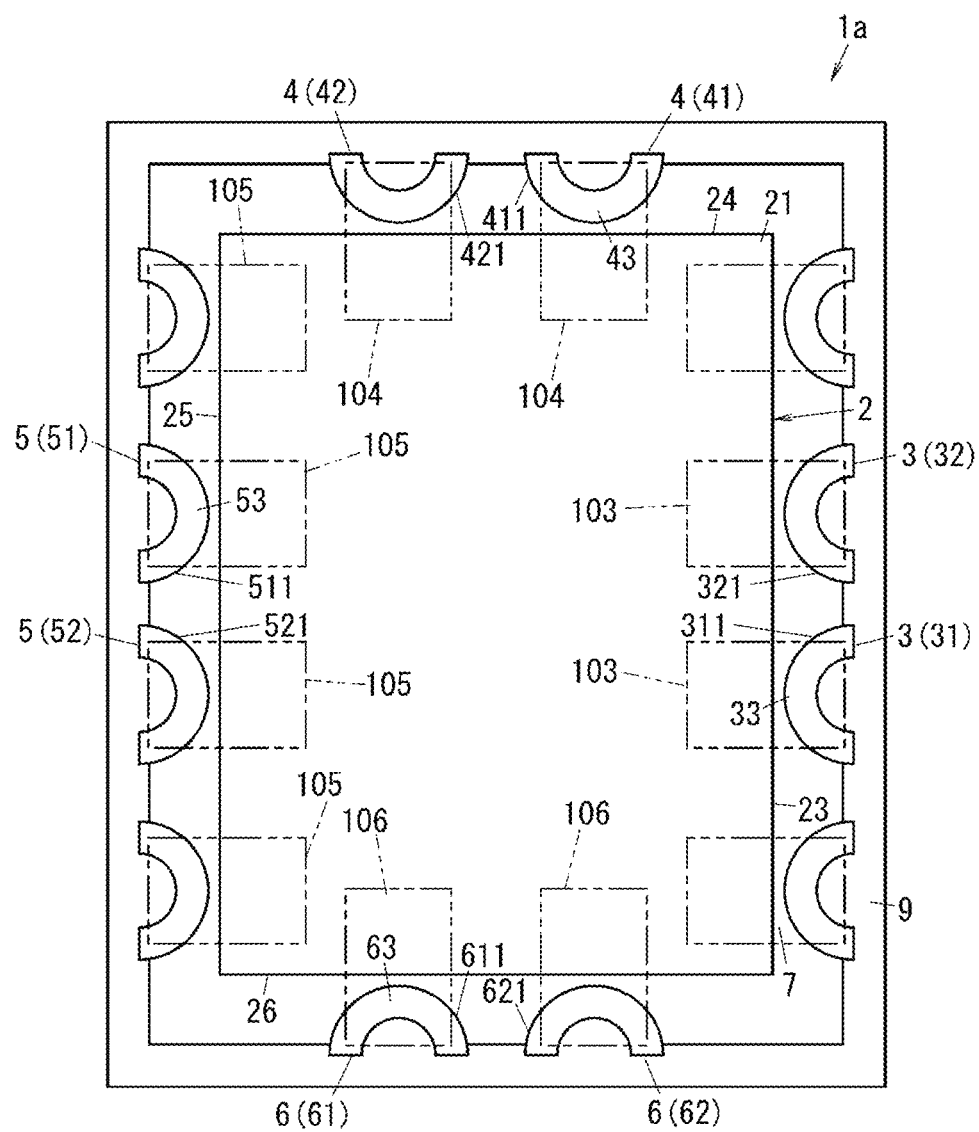
FIG. 13 is a plan view of an electronic component according to a second preferred embodiment of the present invention with a portion cut away.

Hereinafter, an electronic component 1*a* according to a second preferred embodiment of the present invention will be described with reference to FIG. 13.

In the electronic component 1*a* according to the second preferred embodiment, the shape of each of the plurality of side wires 3, the plurality of side wires 4, the plurality of side wires 5, and the plurality of side wires 6 is different from the shape of each of the plurality of side wires 3, the plurality of side wires 4, the plurality of side wires 5, and the plurality of side wires 6 in the electronic component 1 according to the first preferred embodiment. For the electronic component 1*a* according to the second preferred embodiment, the same reference signs denote component elements the same as or similar to those of the electronic component 1 according to the first preferred embodiment, and the description is omitted.

In the electronic component 1*a* according to the second preferred embodiment, as in the case of the electronic component 1 according to the first preferred embodiment, each of the plurality of side wires 3 includes the bent portion 33 bent when viewed in plan in the thickness direction D1 of the substrate 2 when viewed in plan in the thickness direction D1 of the substrate 2. In the electronic component 1*a* according to the second preferred embodiment, as in the case of the electronic component 1 according to the first preferred embodiment, each of the plurality of side wires 4 includes the bent portion 43 bent when viewed in plan in the thickness direction D1 of the substrate 2. In the electronic component 1*a* according to the second preferred embodiment, as in the case of the electronic component 1 according to the first preferred embodiment, each of the plurality of side wires 5 includes the bent portion 53 bent when viewed in plan in the thickness direction D1 of the substrate 2. In the electronic component 1*a* according to the second preferred embodiment, as in the case of the electronic component 1 according to the first preferred embodiment, each of the plurality of side wires 6 includes the bent portion 63 bent when viewed in plan in the thickness direction D1 of the substrate 2. Here, in the electronic component 1*a* according to the second preferred embodiment, each of the plurality of side wires 3, the plurality of side wires 4, the plurality of side wires 5, and the plurality of side wires 6 has a circular arc shape when viewed in plan in the thickness direction D1 of the substrate 2. More specifically, each of the plurality of side wires 3, the plurality of side wires 4, the plurality of side wires 5, and the plurality of side wires 6 has a circular arc shape that opens on the side opposite from the substrate 2 side when viewed in plan in the thickness direction D1 of the substrate 2.

With the electronic component 1*a* according to the second preferred embodiment, as in the case of the electronic component 1 according to the first preferred embodiment, the number of side wires 3 provided on the side surface 23 of the substrate 2, the number of side wires 4 provided on the side surface 24 of the substrate 2, the number of side wires 5 provided on the side surface 25 of the substrate 2, and the number of side wires 6 provided on the side surface 26 of the substrate 2 can be further increased.

A non-limiting example manufacturing method for the electronic component 1*a* according to the second preferred embodiment is the same as or similar to the manufacturing method for the electronic component 1 according to the first preferred embodiment, so the description is omitted.

Third Preferred Embodiment

Figure 14:
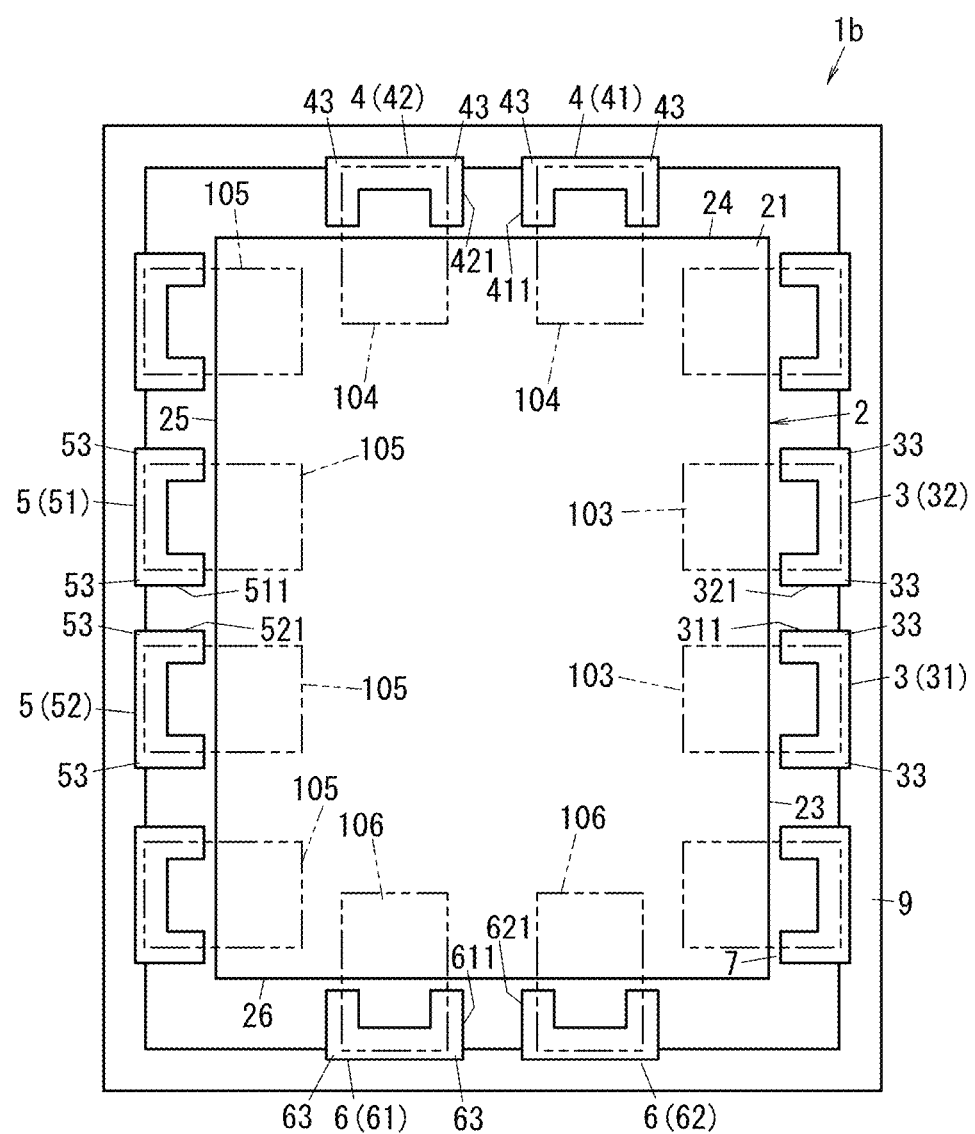
FIG. 14 is a plan view of an electronic component according to a third preferred embodiment of the present invention with a portion cut away.

Hereinafter, an electronic component 1*b* according to a third preferred embodiment of the present invention will be described with reference to FIG. 14.

In the electronic component 1*b* according to the third preferred embodiment, the shape of each of the plurality of side wires 3, the plurality of side wires 4, the plurality of side wires 5, and the plurality of side wires 6 is different from the shape of each of the plurality of side wires 3, the plurality of side wires 4, the plurality of side wires 5, and the plurality of side wires 6 in the electronic component 1 according to the first preferred embodiment. For the electronic component 1*b* according to the third preferred embodiment, the same reference signs denote component elements the same as or similar to those of the electronic component 1 according to the first preferred embodiment, and the description is omitted.

In the electronic component 1*b* according to the third preferred embodiment, as in the case of the electronic component 1 according to the first preferred embodiment, each of the plurality of side wires 3 includes the bent portions 33 bent when viewed in plan in the thickness direction D1 of the substrate 2 when viewed in plan in the thickness direction D1 of the substrate 2. In the electronic component 1b according to the third preferred embodiment, as in the case of the electronic component 1 according to the first preferred embodiment, each of the plurality of side wires 4 includes the bent portions 43 bent when viewed in plan in the thickness direction D1 of the substrate 2. In the electronic component 1b according to the third preferred embodiment, as in the case of the electronic component 1 according to the first preferred embodiment, each of the plurality of side wires 5 includes the bent portions 53 bent when viewed in plan in the thickness direction D1 of the substrate 2. In the electronic component 1b according to the third preferred embodiment, as in the case of the electronic component 1 according to the first preferred embodiment, each of the plurality of side wires 6 includes the bent portions 63 bent when viewed in plan in the thickness direction D1 of the substrate 2. Here, in the electronic component 1b according to the third preferred embodiment, each of the plurality of side wires 3, the plurality of side wires 4, the plurality of side wires 5, and the plurality of side wires 6 has a U-shape when viewed in plan in the thickness direction D1 of the substrate 2. More specifically, each of the plurality of side wires 3, the plurality of side wires 4, the plurality of side wires 5, and the plurality of side wires 6 has a U-shape that opens on the substrate 2 side when viewed in plan in the thickness direction D1 of the substrate 2. Each of the plurality of side wires 3 includes the two bent portions 33. Each of the plurality of side wires 4 includes the two bent portions 43. Each of the plurality of side wires 5 includes the two bent portions 53. Each of the plurality of side wires 6 includes the two bent portions 63.

With the electronic component 1b according to the third preferred embodiment, as in the case of the electronic component 1 according to the first preferred embodiment, the number of side wires 3 provided on the side surface 23 of the substrate 2, the number of side wires 4 provided on the side surface 24 of the substrate 2, the number of side wires 5 provided on the side surface 25 of the substrate 2, and the number of side wires 6 provided on the side surface 26 of the substrate 2 can be further increased.

A non-limiting example manufacturing method for the electronic component 1b according to the third preferred embodiment is the same as or similar to the manufacturing method for the electronic component 1 according to the first preferred embodiment, so the description is omitted.

Fourth Preferred Embodiment

Figure 15:
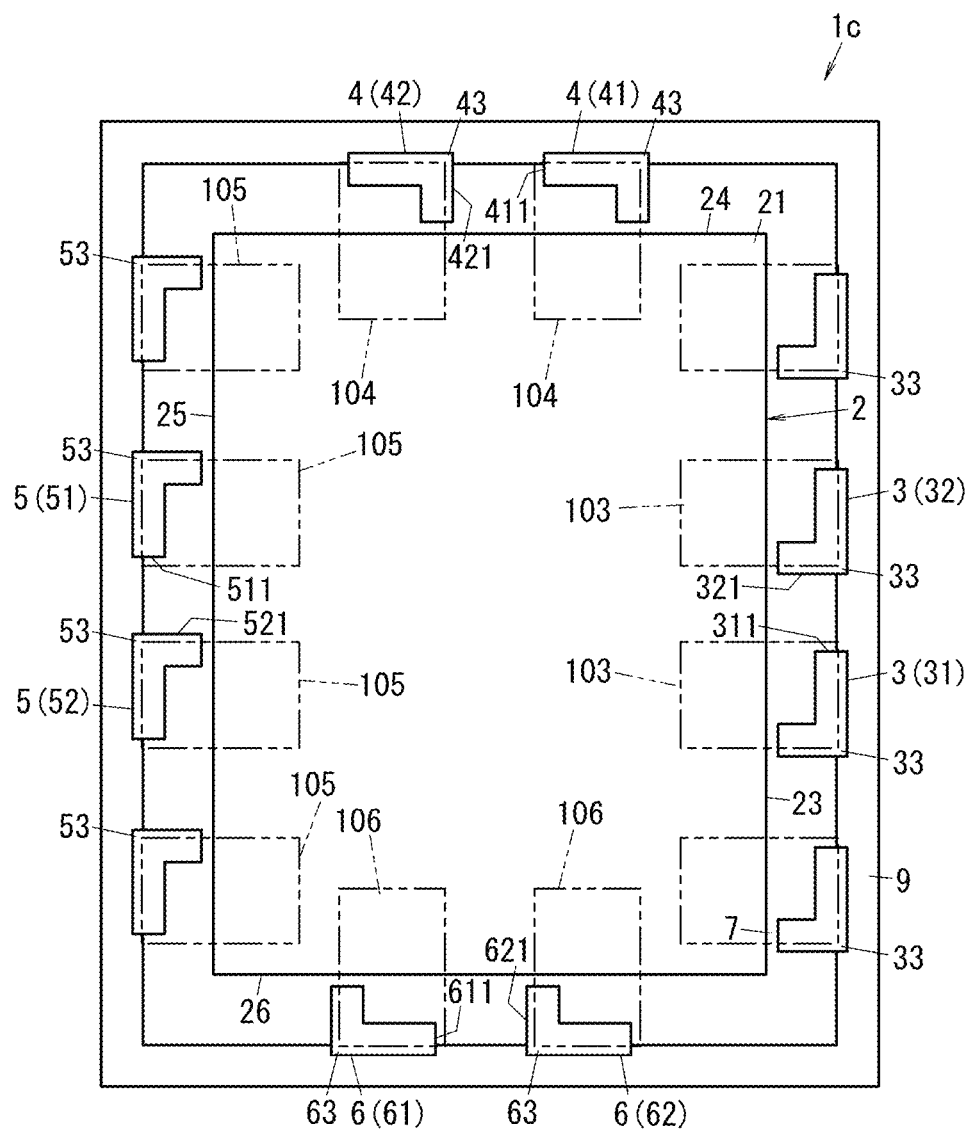
FIG. 15 is a plan view of an electronic component according to a fourth preferred embodiment of the present invention with a portion cut away.

Hereinafter, an electronic component 1c according to a fourth preferred embodiment of the present invention will be described with reference to FIG. 15.

In the electronic component 1c according to the fourth preferred embodiment, the shape of each of the plurality of side wires 3, the plurality of side wires 4, the plurality of side wires 5, and the plurality of side wires 6 is different from the shape of each of the plurality of side wires 3, the plurality of side wires 4, the plurality of side wires 5, and the plurality of side wires 6 in the electronic component 1 according to the first preferred embodiment. For the electronic component 1c according to the fourth preferred embodiment, the same reference signs denote component elements the as or similar to those of the electronic component 1 according to the first preferred embodiment, and the description is omitted.

In the electronic component 1c according to the fourth preferred embodiment, as in the case of the electronic component 1 according to the first preferred embodiment, each of the plurality of side wires 3 includes the bent portion 33 bent when viewed in plan in the thickness direction D1 of the substrate 2 when viewed in plan in the thickness direction D1 of the substrate 2. In the electronic component 1c according to the fourth preferred embodiment, as in the case of the electronic component 1 according to the first preferred embodiment, each of the plurality of side wires 4 includes the bent portion 43 bent when viewed in plan in the thickness direction D1 of the substrate 2. In the electronic component 1c according to the fourth preferred embodiment, as in the case of the electronic component 1 according to the first preferred embodiment, each of the plurality of side wires 5 includes the bent portion 53 bent when viewed in plan in the thickness direction D1 of the substrate 2. In the electronic component 1c according to the fourth preferred embodiment, as in the case of the electronic component 1 according to the first preferred embodiment, each of the plurality of side wires 6 includes the bent portion 63 bent when viewed in plan in the thickness direction D1 of the substrate 2. Here, in the electronic component 1c according to the fourth preferred embodiment, each of the plurality of side wires 3, the plurality of side wires 4, the plurality of side wires 5, and the plurality of side wires 6 has an L-shape when viewed in plan in the thickness direction D1 of the substrate 2. More specifically, each of the plurality of side wires 3, the plurality of side wires 4, the plurality of side wires 5, and the plurality of side wires 6 has an L-shape including a first portion extending along a direction perpendicular or substantially perpendicular to the direction along the outer periphery of the substrate 2 when viewed in plan in the thickness direction D1 of the substrate 2, and a second portion extending along the direction along the outer periphery of the substrate 2 from an end of the first portion, far from the substrate 2.

With the electronic component 1c according to the fourth preferred embodiment, as in the case of the electronic component 1 according to the first preferred embodiment, the number of side wires 3 provided on the side surface 23 of the substrate 2, the number of side wires 4 provided on the side surface 24 of the substrate 2, the number of side wires 5 provided on the side surface 25 of the substrate 2, and the number of side wires 6 provided on the side surface 26 of the substrate 2 can be further increased.

In the electronic component 1c according to the fourth preferred embodiment, the surfaces 311, 321, opposed to each other at a shortest distance, of the adjacent first side wire 31 and second side wire 32 of the plurality of side wires 3 are parallel or substantially parallel to each other, and the areas of the surfaces 311, 321 opposed to each other at a shortest distance are different. With this configuration, in the electronic component 1c according to the fourth preferred embodiment, as compared to the electronic component 1b according to the third preferred embodiment, capacitive coupling between the adjacent first side wire 31 and second side wire 32 is reduced or prevented.

A non-limiting example manufacturing method for the electronic component 1c according to the fourth preferred embodiment is the same as or similar to the manufacturing method for the electronic component 1 according to the first preferred embodiment, so the description is omitted.

Fifth Preferred Embodiment

Figure 16:
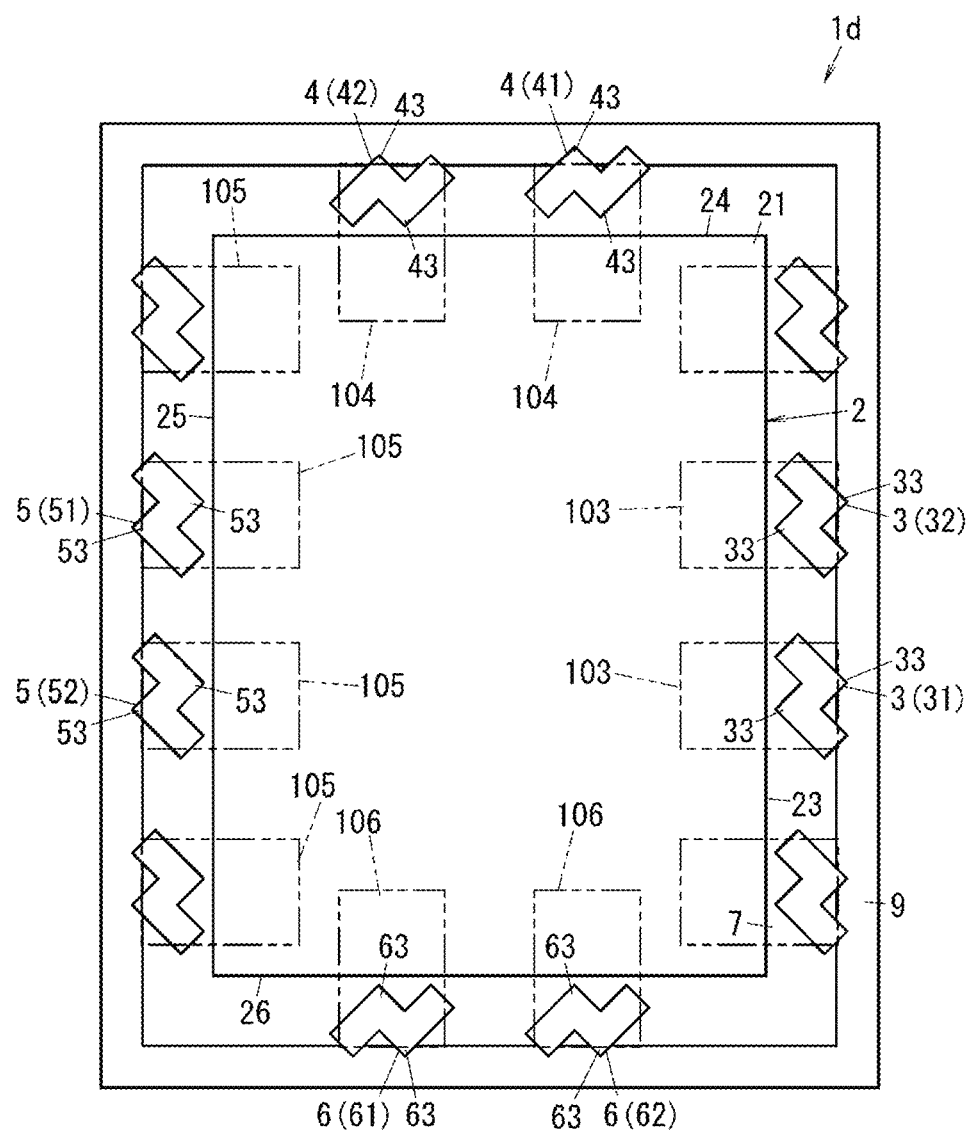
FIG. 16 is a plan view of an electronic component according to a fifth preferred embodiment of the present invention with a portion cut away.

Hereinafter, an electronic component 1d according to a fifth preferred embodiment of the present invention will be described with reference to FIG. 16.

In the electronic component 1d according to the fifth preferred embodiment, the shape of each of the plurality of side wires 3, the plurality of side wires 4, the plurality of side wires 5, and the plurality of side wires 6 is different from the shape of each of the plurality of side wires 3, the plurality of side wires 4, the plurality of side wires 5, and the plurality of side wires 6 in the electronic component 1 according to the first preferred embodiment. For the electronic component 1d according to the fifth preferred embodiment, the same reference signs denote component elements the same as or similar to those of the electronic component 1 according to the first preferred embodiment, and the description is omitted.

In the electronic component 1d according to the fifth preferred embodiment, as in the case of the electronic component 1 according to the first preferred embodiment, each of the plurality of side wires 3 includes the bent portions 33 bent when viewed in plan in the thickness direction D1 of the substrate 2 when viewed in plan in the thickness direction D1 of the substrate 2. In the electronic component 1d according to the fifth preferred embodiment, as in the case of the electronic component 1 according to the first preferred embodiment, each of the plurality of side wires 4 includes the bent portions 43 bent when viewed in plan in the thickness direction D1 of the substrate 2. In the electronic component 1d according to the fifth preferred embodiment, as in the case of the electronic component 1 according to the first preferred embodiment, each of the plurality of side wires 5 includes the bent portions 53 bent when viewed in plan in the thickness direction D1 of the substrate 2. In the electronic component 1d according to the fifth preferred embodiment, as in the case of the electronic component 1 according to the first preferred embodiment, each of the plurality of side wires 6 includes the bent portions 63 bent when viewed in plan in the thickness direction D1 of the substrate 2. Here, in the electronic component 1d according to the fifth preferred embodiment, each of the plurality of side wires 3, the plurality of side wires 4, the plurality of side wires 5, and the plurality of side wires 6 has a wave shape (here, triangular wave shape) when viewed in plan in the thickness direction D1 of the substrate 2. Each of the plurality of side wires 3 includes the two bent portions 33. Each of the plurality of side wires 4 includes the two bent portions 43. Each of the plurality of side wires 5 includes the two bent portions 53. Each of the plurality of side wires 6 includes the two bent portions 63.

With the electronic component 1d according to the fifth preferred embodiment, as in the case of the electronic component 1 according to the first preferred embodiment, the number of side wires 3 provided on the side surface 23 of the substrate 2, the number of side wires 4 provided on the side surface 24 of the substrate 2, the number of side wires 5 provided on the side surface 25 of the substrate 2, and the number of side wires 6 provided on the side surface 26 of the substrate 2 can be further increased.

A non-limiting example manufacturing method for the electronic component 1d according to the fifth preferred embodiment is the same as or similar to the manufacturing method for the electronic component 1 according to the first preferred embodiment, so the description is omitted.

The above-described first to fifth preferred embodiments, and the like each are just various preferred embodiments of the present invention.

The above-described first to fifth preferred embodiments, and the like, each may be modified into various structures and configurations according to design, or the like, as long as the advantageous effects of the present invention are achieved.

For example, the substrate 2 includes the four side surfaces 23 to 26. However, the configuration is not limited thereto. For example, edges may be chamfered, and the substrate 2 may include more than the four side surfaces 23 to 26.

The shape of the substrate 2 when viewed in plan in the thickness direction D1 of the substrate 2 is not limited to a rectangular or substantially rectangular shape or a square or substantially square shape and may be, for example, a hexagonal shape or a circular shape.

The substrate 2 of the electronic component 1 including an acoustic wave device is not limited to a piezoelectric substrate and may be, for example, a multilayer substrate as long as the substrate 2 has piezoelectricity. More specifically, the piezoelectric substrate may be, for example, a multilayer substrate including a support substrate, a low acoustic velocity film, and a piezoelectric film.

Here, the low acoustic velocity film is directly or indirectly provided on the support substrate. The piezoelectric film is directly or indirectly provided on the low acoustic velocity film.

In the low acoustic velocity film, a bulk wave propagates through the low acoustic velocity film at an acoustic velocity lower than a bulk wave propagates through the piezoelectric film. In the support substrate, a bulk wave propagates through the support substrate at an acoustic velocity higher than an acoustic wave propagates through the piezoelectric film. The materials of the piezoelectric film, the low acoustic velocity film, and the support substrate are respectively, for example, lithium tantalate, silicon oxide, and silicon. The thickness of the piezoelectric film is, for example, less than or equal to $3.5\lambda$ where the wavelength of an acoustic wave, which is determined by the electrode finger pitch of the interdigital transducer electrode, is $\lambda$. The thickness of the low acoustic velocity film is, for example, less than or equal to $2.0\lambda$.

In the electronic component 1, when the substrate 2 is a multilayer substrate, the size of each of the piezoelectric film and the low acoustic velocity film may be smaller than the size of the support substrate when viewed in plan in the thickness direction D1 of the substrate 2.

The materials of the piezoelectric film, the low acoustic velocity film, and the support substrate are not limited to the above-described examples.

For example, the piezoelectric film may be made of any one of, for example, lithium tantalate, lithium niobate, zinc oxide (ZnO), aluminum nitride (AlN), and lead zirconate titanate (PZT). The low acoustic velocity film may include, for example, at least one material selected from a group consisting of chemical compounds obtained by adding fluorine, carbon, or boron to silicon oxide, glass, silicon oxynitride, tantalum oxide. The support substrate merely needs to include, for example, at least one material selected from a group consisting of silicon, aluminum nitride, aluminum oxide, silicon carbide, silicon nitride, sapphire, lithium tantalate, lithium niobate, quartz crystal, alumina, zirconia, cordierite, mullite, steatite, forsterite, magnesia, and diamond.

The piezoelectric substrate may include, for example, an adhesion layer interposed between the low acoustic velocity film and the piezoelectric film. The adhesion layer is made of, for example, a resin (epoxy resin or polyimide resin). The piezoelectric substrate may include a dielectric film between the low acoustic velocity film and the piezoelectric film, on the piezoelectric film, or below the low acoustic velocity film.

The piezoelectric substrate may be, for example, a multilayer substrate including a support substrate, a high acoustic velocity film, a low acoustic velocity film, and a piezoelectric film.

Here, the high acoustic velocity film is directly or indirectly provided on the support substrate. The low acoustic velocity film is directly or indirectly provided on the high acoustic velocity film. The piezoelectric film is directly or indirectly provided on the low acoustic velocity film. In the high acoustic velocity film, a bulk wave propagates through the high acoustic velocity film at an acoustic velocity higher than an acoustic wave propagates through the piezoelectric film. In the low acoustic velocity film, a bulk wave propagates through the low acoustic velocity film at an acoustic velocity lower than a bulk wave propagates through the piezoelectric film.

The high acoustic velocity film is made of any one of a piezoelectric body, such as, for example, diamond-like carbon, aluminum nitride, aluminum oxide, silicon carbide, silicon nitride, silicon, sapphire, lithium tantalate, lithium niobate, and quartz crystal, various ceramics, such as alumina, zirconia, cordierite, mullite, steatite, and forsterite, magnesia, diamond, a material including any one of the above materials as a main ingredient, and a material containing a mixture of some of the above materials as a main ingredient.

For the thickness of the high acoustic velocity film, since the high acoustic velocity film encloses an acoustic wave in the piezoelectric film and the low acoustic velocity film, the thickness of the high acoustic velocity film is preferably thicker. The piezoelectric substrate may include an adhesion layer, a dielectric film, or the like as another film other than the high acoustic velocity film, the low acoustic velocity film, or the piezoelectric film.

The acoustic wave device defining each of the electronic components 1 to 1*d* is not limited to an SAW (surface acoustic wave) resonator and may be, for example, a BAW (bulk acoustic wave) resonator or the like.

The BAW resonator includes a substrate, a first electrode, a piezoelectric film, and a second electrode. The first electrode is provided on the substrate. The piezoelectric film is provided on the first electrode. The second electrode is provided on the piezoelectric film.

The substrate in the BAW resonator includes, for example, a silicon substrate and an electrically insulating film provided on the silicon substrate. The electrically insulating film is, for example, a silicon oxide film. The piezoelectric film is made of, for example, lead zirconate titanate (PZT).

The substrate of the BAW resonator includes a cavity on the side of the first electrode, opposite from the piezoelectric film side. The BAW resonator is, for example, an FBAR (film bulk acoustic resonator). The structure of the BAW resonator defining the FBAR is an example and is not limited. When the electronic component 1 is a BAW resonator, the functional portion 8 is a portion that overlaps the cavity in the thickness direction of the substrate in a laminated body of the first electrode, the piezoelectric film, and the second electrode.

The BAW resonator is not limited to an FBAR and may be, for example, an SMR (solidly mounted resonator).

The electronic component 1 is not limited to an acoustic wave device and may be, for example, a semiconductor chip, such as a power amplifier, a low-noise amplifier, a DC-DC converter, an IC (integrated circuit), an IPD (intelligent power device), an MPU (micro processing unit), a semiconductor memory, and a semiconductor sensor. The electronic component 1 is not limited to an acoustic wave device or a semiconductor chip and may be, for example, an active component, such as a chip capacitor. Therefore, the substrate 2 varies depending on the function, type, and the like of each of the electronic components 1 to 1*d* and is not limited to the piezoelectric substrate. The substrate 2 may be, for example, a silicon substrate, a germanium substrate, a compound semiconductor substrate, an epitaxial substrate, a ceramic element body, a multilayer ceramic substrate, or the like.

When the electronic component 1 is a power amplifier or a low-noise amplifier, the functional portion 8 has an amplification function. In this case, the functional portion 8 is, for example, a transistor portion, such as an HBT (heterojunction bipolar transistor). Therefore, the functional portion 8 is not limited to the case where the functional portion 8 is provided on the first major surface 21 of the substrate 2 and may be provided in the substrate 2.

When the electronic component 1 is a DC-DC converter, the functional portion 8 has a power conversion function. The DC-DC converter is, for example, a one-chip switching regulator.

When the electronic component 1 is an MPU, the functional portion 8 has a logical function. In this case, the functional portion 8 is, for example, a register, an arithmetic circuit, a control circuit, or the like.

The functional portion 8 is not limited to the above-described examples and may be, for example, a circuit portion of a semiconductor chip, an outer connection electrode, or the like.

From the above-described preferred embodiments, and the like, the following preferred embodiments are disclosed in the specification.

An electronic component (1; 1*a*; 1*b*; 1*c*; 1*d*) according to a preferred embodiment of the present invention includes a substrate (2) and a plurality of side wires (3). The substrate (2) includes a first major surface (21), a second major surface (22), and a side surface (23). The plurality of side wires (3) is provided on the side surface (23) of the substrate (2) and spaced apart from each other in a direction along an outer periphery of the substrate (2) when viewed in plan in a thickness direction (D1) of the substrate (2). At least a portion of each of the plurality of side wires (3) is provided indirectly on the side surface (23) of the substrate (2). The electronic component (1; 1*a*; 1*b*; 1*c*; 1*d*) according to the present preferred embodiment further includes an electrically insulating layer (7) interposed between the side surface (23) of the substrate (2) and the at least a portion of each of the plurality of side wires (3). Each of the plurality of side wires (3) includes a bent portion (33) bent when viewed in plan in the thickness direction (D1) of the substrate (2).

With the electronic component (1; 1*a*; 1*b*; 1*c*; 1*d*) according to the present preferred embodiment, the number of the side wires (3) provided on the side surface (23) of the substrate (2) can be further increased.

In an electronic component (1; 1*a*; 1*b*; 1*c*; 1*d*) according to a preferred embodiment of the present invention, a dielectric constant of the electrically insulating layer (7) is lower than a dielectric constant of the substrate (2).

With the electronic component (1; 1*a*; 1*b*; 1*c*; 1*d*) according to the present preferred embodiment, capacitive coupling of the adjacent two side wires (3) via the substrate (2) in the plurality of side wires (3) is reduced or prevented.

In an electronic component (1; 1*a*) according to a preferred embodiment of the present invention, the plurality of side wires (3) include a first side wire (31) and a second side wire (32) adjacent to each other in the direction along the outer periphery of the substrate (2). The first side wire (31) includes a plurality of surfaces that intersect with the thickness direction of the first side wire (31). The second side wire (32) includes a plurality of surfaces that intersect with the thickness direction of the second side wire (32). The first side wire (31) and the second side wire (32) are configured such that, of the plurality of surfaces of the first side wire (31) and the plurality of surfaces of the second side wire (32), the surfaces (311, 321) closest and opposed to each other are not parallel to each other.

With the electronic component (1; 1a) according to the present preferred embodiment, capacitive coupling between the adjacent first side wire (31) and second side wire (32) of the plurality of side wires (3) can be reduced or prevented.

In an electronic component (1c) according to a preferred embodiment of the present invention, the plurality of side wires (3) include a first side wire (31) and a second side wire (32) adjacent to each other in the direction along the outer periphery of the substrate (2). Surfaces (311, 321), opposed to each other at a shortest distance, of the first side wire (31) and the second side wire (32) are parallel or substantially parallel to each other, and the areas of the surfaces (311, 321) opposed to each other at a shortest distance are different.

With the electronic component (1c) according to the present preferred embodiment, capacitive coupling between the first side wire (31) and the second side wire (32) is reduced or prevented.

In an electronic component (1; 1a; 1b; 1c; 1d) according to a preferred embodiment of the present invention, the plurality of side wires (3) include a first side wire (31) and a second side wire (32) adjacent to each other in the direction along the outer periphery of the substrate (2). In the electronic component (1; 1a; 1b; 1c; 1d), a portion of the electrically insulating layer (7) is interposed between the first side wire (31) and the second side wire (32) in the direction along the outer periphery of the substrate (2).

With the electronic component (1; 1a; 1b; 1c; 1d) according to the present preferred embodiment, the shape stability of each of the first side wire (31) and the second side wire (32) is improved, and variations in distance between the first side wire (31) and the second side wire (32) are reduced or prevented.

In an electronic component (1; 1a) according to a preferred embodiment of the present invention, the first side wire (31) includes a plurality of surfaces that intersect with the thickness direction of the first side wire (31). The second side wire (32) includes a plurality of surfaces that intersect with the thickness direction of the second side wire (32). The first side wire (31) and the second side wire (32) are configured such that, of the plurality of surfaces of the first side wire (31) and the plurality of surfaces of the second side wire (32), the surfaces (311, 321) closest and opposed to each other are not parallel to each other.

With the electronic component (1; 1a) according to the present preferred embodiment, capacitive coupling between the first side wire (31) and the second side wire (32) can be reduced or prevented.

In an electronic component (1c) according to a preferred embodiment of the present invention, surfaces (311, 321), opposed to each other at a shortest distance, of the first side wire (31) and the second side wire (32) are parallel or substantially parallel to each other, and the areas of the surfaces (311, 321) opposed to each other at a shortest distance are different.

With the electronic component (1c) according to the present preferred embodiment, capacitive coupling between the first side wire (31) and the second side wire (32) is reduced or prevented.

An electronic component (1; 1a; 1b; 1c; 1d) according to a preferred embodiment of the present invention further includes a functional portion (8). The electronic component (1; 1a; 1b; 1c; 1d) further includes a functional portion (8) on or in at least one of the first major surface (21) of the substrate (2), the second major surface (22) of the substrate (2), and an inside of the substrate (2) in the thickness direction (D1) of the substrate (2). At least one of the plurality of side wires (3) is connected to the functional portion (8).

An electronic component (1; 1a; 1b; 1c; 1d) according to a preferred embodiment of the present invention further includes a wiring portion (103) connected to at least one of the plurality of side wires (3). The wiring portion (103) overlaps a portion of the substrate (2) and at least a portion of at least one side wire (3) when viewed in plan in the thickness direction (D1) of the substrate (2).

With the electronic component (1; 1a; 1b; 1c; 1d) according to the present preferred embodiment, connectivity between the plurality of side wires (3) and the functional portion (8) and the like on the substrate (2) is improved.

An electronic component (1; 1a; 1b; 1c; 1d) according to a preferred embodiment of the present invention further includes a second electrically insulating layer (9) different from the first electrically insulating layer defining and functioning as the electrically insulating layer (7). The second electrically insulating layer (9) covers the plurality of side wires (3) on a side of the plurality of side wires (3), opposite from a side on which the first electrically insulating layer is provided.

With the electronic component (1; 1a; 1b; 1c; 1d) according to the present preferred embodiment, reliability is improved.

In an electronic component (1; 1a; 1b; 1c; 1d) according to a preferred embodiment of the present invention, a material of the first electrically insulating layer (electrically insulating layer 7) and a material of the second electrically insulating layer (9) are different from each other.

With the electronic component (1; 1a; 1b; 1c; 1d) according to the present preferred embodiment, there is room for selecting the materials of the first electrically insulating layer and the second electrically insulating layer (9).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
  a substrate including a first major surface, a second major surface, and a side surface; and
  a plurality of side wires on the side surface of the substrate and spaced apart from each other in a direction along an outer periphery of the substrate when viewed in plan in a thickness direction of the substrate; wherein
  at least one portion of each of the plurality of side wires is indirectly provided on the side surface of the substrate;
  the electronic component further comprises an electrically insulating layer interposed between the side surface of the substrate and the at least one portion of each of the plurality of side wires; and each of the plurality of side wires includes a bent portion bent when viewed in plan in the thickness direction of the substrate.

2. The electronic component according to claim 1, wherein a dielectric constant of the electrically insulating layer is lower than a dielectric constant of the substrate.

3. The electronic component according to claim 1, wherein
the plurality of side wires include a first side wire and a second side wire adjacent to each other in the direction along the outer periphery of the substrate;
the first side wire includes a plurality of surfaces that intersect with a thickness direction of the first side wire;
the second side wire includes a plurality of surfaces that intersect with a thickness direction of the second side wire; and
of the plurality surfaces of the first side wire and the plurality of surfaces of the second side wire, the surfaces opposed and closest to each other are not parallel to each other.

4. The electronic component according to claim 1, wherein
the plurality of side wires includes a first side wire and a second side wire adjacent to each other in the direction along the outer periphery of the substrate;
the first side wire and the second side wire are formed such that surfaces of the first side wire and the second side wire opposed to each other at a shortest distance are parallel or substantially parallel to each other; and
the surfaces opposed to each other at the shortest distance have different areas.

5. The electronic component according to claim 2, wherein
the plurality of side wires includes a first side wire and a second side wire adjacent to each other in the direction along the outer periphery of the substrate; and
a portion of the electrically insulating layer is interposed between the first side wire and the second side wire in the direction along the outer periphery of the substrate.

6. The electronic component according to claim 5, wherein
the first side wire includes a plurality of surfaces that intersect with a thickness direction of the first side wire;
the second side wire includes a plurality of surfaces that intersect with a thickness direction of the second side wire; and
of the plurality surfaces of the first side wire and the plurality of surfaces of the second side wire, the surfaces opposed and closest to each other are not parallel to each other.

7. The electronic component according to claim 5, wherein
surfaces of the first side wire and the second side wire opposed to each other at a shortest distance are parallel or substantially parallel to each other; and
the surfaces opposed to each other at the shortest distance have different areas.

8. The electronic component according to claim 1, further comprising:
a functional portion on or in at least one of the first major surface of the substrate, the second major surface of the substrate, and an inside of the substrate in the thickness direction of the substrate; wherein
at least one of the plurality of side wires is connected to the functional portion.

9. The electronic component according to claim 1, further comprising:
a wiring portion connected to at least one of the plurality of side wires; wherein
the wiring portion overlaps at least a portion of the at least one side wire and a portion of the substrate when viewed in plan in the thickness direction of the substrate.

10. The electronic component according to claim 1, further comprising:
a second electrically insulating layer different from the electrically insulating layer; wherein
the second electrically insulating layer covers the plurality of side wires on a side of the plurality of side wires, opposite from a side on which the first electrically insulating layer is provided.

11. The electronic component according to claim 10, wherein a material of the first electrically insulating layer and a material of the second electrically insulating layer are different from each other.

12. The electronic component according to claim 1, wherein the plurality of side wires are spaced apart from each other at equal or substantially equal intervals.

13. The electronic component according to claim 1, wherein each of the plurality of side wires includes at least one of copper, silver, nickel, gold, palladium, platinum, aluminum, tin, or an alloy an alloy including at least one of copper, silver, nickel, gold, palladium, platinum, aluminum, tin.

14. The electronic component according to claim 1, wherein each of the plurality of side wires has the same or substantially the same shape.

15. The electronic component according to claim 1, wherein each of the plurality of side wires has a V-shape or a substantially V-shape.

16. The electronic component according to claim 1, wherein a dielectric constant of the electrically insulating layer is about 1.5 to about 5.

17. The electronic component according to claim 1, wherein each of the plurality of side wires has a circular arc shape or a substantially circular arc shape.

18. The electronic component according to claim 1, wherein each of the plurality of side wires has a U-shape or a substantially U-shape.

19. The electronic component according to claim 1, wherein each of the plurality of side wires has an L-shape or a substantially L-shape.

20. The electronic component according to claim 1, wherein each of the plurality of side wires has a triangular wave shape or a substantially triangular wave shape.

* * * * *